(12) United States Patent
Lim

(10) Patent No.: US 11,886,661 B2
(45) Date of Patent: Jan. 30, 2024

(54) DISPLAY DEVICE

(71) Applicant: Samsung Display Co., Ltd., Yongin-Si (KR)

(72) Inventor: Sang Hyun Lim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/077,257

(22) Filed: Dec. 8, 2022

(65) Prior Publication Data

US 2023/0105740 A1     Apr. 6, 2023

Related U.S. Application Data

(62) Division of application No. 17/827,227, filed on May 27, 2022, now Pat. No. 11,550,425, which is a
(Continued)

(30) Foreign Application Priority Data

Feb. 21, 2020 (KR) .................. 10-2020-0021842

(51) Int. Cl.
*G06F 3/041*     (2006.01)
*G06F 3/044*     (2006.01)
(Continued)

(52) U.S. Cl.
CPC ........ *G06F 3/04166* (2019.05); *G06F 3/0412* (2013.01); *G06F 3/0446* (2019.05);
(Continued)

(58) Field of Classification Search
CPC ......... G09G 2320/0233; G09G 3/3225; G09G 3/3233; G09G 5/12; G06F 3/0412;
(Continued)

(56) References Cited

U.S. PATENT DOCUMENTS

| | | | |
|---|---|---|---|
| 2008/0018568 A1* | 1/2008 | Chen | .................... G09G 3/3233 345/82 |
| 2008/0309627 A1 | 12/2008 | Hotelling et al. | |

(Continued)

FOREIGN PATENT DOCUMENTS

| | | |
|---|---|---|
| KR | 10-2018-0064625 A | 6/2018 |
| KR | 10-1871667 B1 | 6/2018 |
| KR | 10-2019-0038707 A | 4/2019 |

*Primary Examiner* — Robin J Mishler
(74) *Attorney, Agent, or Firm* — Innovation Counsel LLP

(57) ABSTRACT

A display device according to an example embodiment includes a display portion displaying an image, and a sense portion that is disposed over one side of the display portion, and senses an external input, wherein the sense portion includes: at least one of first sense electrodes receiving a first sense signal that is changed in response to the external input, at least one of second sense electrodes that are disposed at a distance from the first sense electrodes, wherein the first sense electrodes are disposed between the second sense electrodes, and at least one of compensation electrode that are disposed spaced apart from and between the first sense electrodes, and to which a compensation signal is applied, wherein the compensation signal and the first sense signal are inverted in phase.

5 Claims, 23 Drawing Sheets

Related U.S. Application Data division of application No. 17/023,455, filed on Sep. 17, 2020, now Pat. No. 11,372,500.

(51) Int. Cl.
| | |
|---|---|
| *G09G 3/3225* | (2016.01) |
| *G09G 5/02* | (2006.01) |
| *H10K 59/40* | (2023.01) |
| *G09G 5/12* | (2006.01) |

(52) U.S. Cl.
CPC ............ *G09G 3/3225* (2013.01); *G09G 5/12* (2013.01); *G06F 3/0443* (2019.05); *G06F 3/0445* (2019.05); *G09G 2320/0233* (2013.01); *H10K 59/40* (2023.02)

(58) Field of Classification Search
CPC ............ G06F 3/04164; G06F 3/04166; G06F 3/0443; G06F 3/0445; G06F 3/0446; G06F 3/0448
See application file for complete search history.

(56) References Cited

U.S. PATENT DOCUMENTS

| | | |
|---|---|---|
| 2012/0113339 A1 | 5/2012 | Park et al. |
| 2015/0035736 A1 | 2/2015 | Lu et al. |
| 2018/0366081 A1 | 12/2018 | Jangda et al. |
| 2019/0102017 A1 | 4/2019 | Kim et al. |
| 2019/0286269 A1 | 9/2019 | Choi et al. |

\* cited by examiner

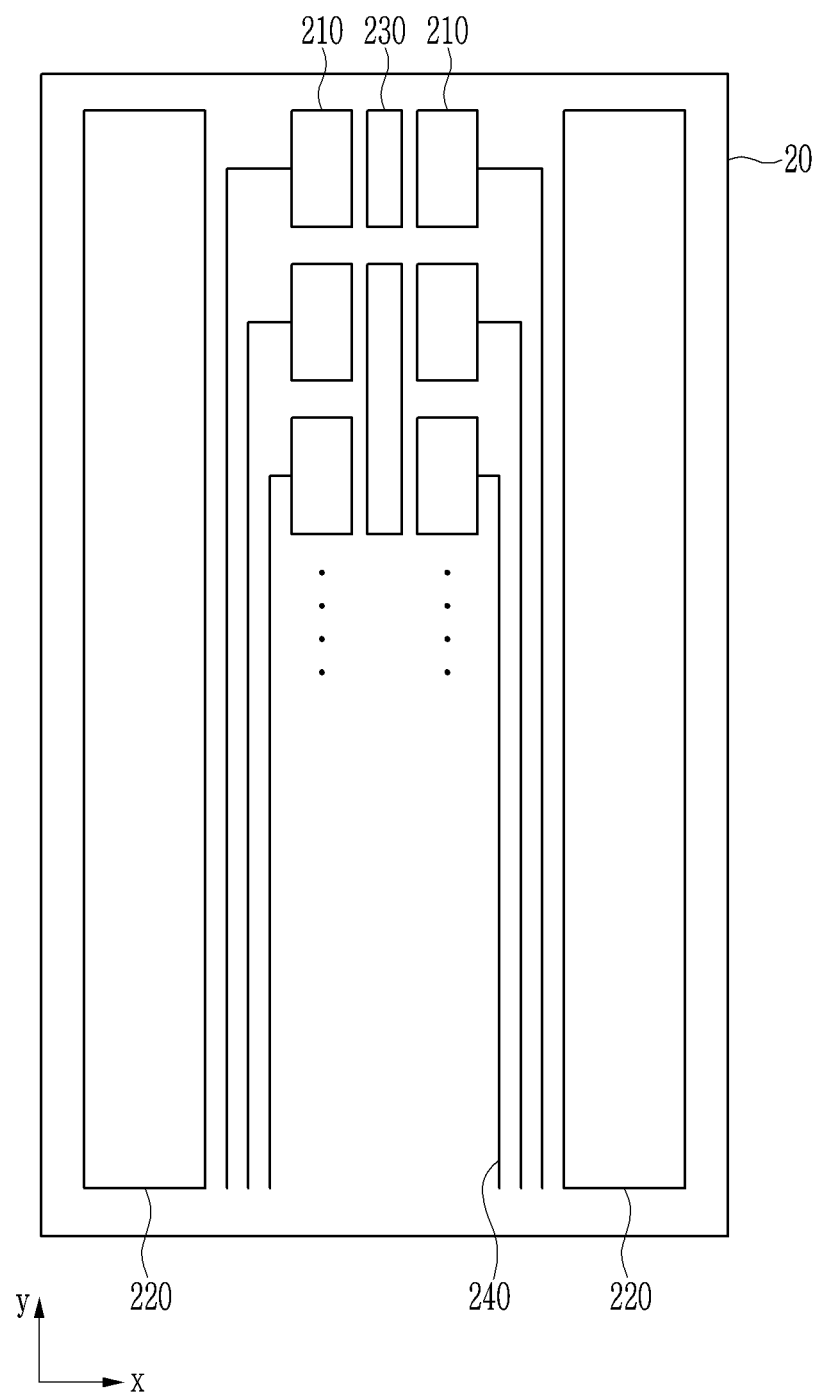

DISPLAY DEVICE

CROSS-REFERENCE TO RELATED APPLICATION

This application is a divisional application of U.S. patent application Ser. No. 17/827,227, filed on May 27, 2022, which is a divisional application of U.S. patent application Ser. No. 17/023,455, filed on Sep. 17, 2020 (now U.S. Pat. No. 11,372,500), which claims priority to and the benefit of Korean Patent Application No. 10-2020-0021842 filed in the Korean Intellectual Property Office on Feb. 21, 2020, the entire contents of which are incorporated herein by reference.

BACKGROUND

(a) Technical Field

Generally, the present disclosure relates to a display device. More particularly, the present disclosure relates to a display device that includes a sense electrode.

(b) Description of the Related Art

As a device displaying an image, a display device includes a liquid crystal display (LCD), a light emitting diode device, a quantum dot display, and the like.

Recently, a display device including a touch sensor capable of directly inputting information using a user's finger or pen has been used. The touch sensor may be attached to one side of the display panel, or may be integrally formed with the display panel.

The touch sensor may sense an external signal by a plurality of sense electrodes and transmit a sense signal to the display panel. However, when noise is included in the sense signal, it may affect the luminance of the display panel.

The above information disclosed in this Background section is only for enhancement of understanding of the background of the present disclosure, and therefore it may contain information that does not form the prior art that is already known in this country to a person of ordinary skill in the art.

SUMMARY

Example embodiments have been made an effort to provide a display device that can prevent luminance change.

A display device according to an example embodiment includes: a display portion displaying an image; and a sense portion disposed over one side of the display portion and configured to sense an external input, wherein the sense portion includes: at least one of first sense electrodes receiving a first sense signal that is changed in response to the external input; at least one of second sense electrodes that are disposed at a distance; and at least one of compensation electrodes that are disposed at a distance from and between the first sense electrodes, and to which a compensation signal is applied, and wherein the compensation signal and the first sense signal are inverted in phase.

Each of the compensation electrodes may be disposed at a distance from the first sense electrodes, while being surrounded by the first sense electrodes.

Each of the first sense electrodes and each of the second sense electrodes may be disposed in a first direction and a second direction, respectively, and arranged in a mesh pattern, and, each of the compensation electrodes may be arranged in a direction that crosses a direction in which each of the plurality of first sense electrodes is arranged.

The first sense electrode and the compensation electrode may be disposed over the same layer.

The first sense electrode and the compensation electrode may be disposed over different layers, and the compensation electrode may be disposed to not overlap the first sense electrode.

The first sense electrode and the compensation electrode may be disposed over different layers, and the compensation electrode may be disposed to overlap the first sense electrode.

The display device may further include a sense wire disposed between the first sense electrode and the second sense electrode, and electrically connected with the first sense electrode or the second sense electrode.

One of first sense electrodes and the second sense electrodes may be dispersed in a first direction, and the other one may be dispersed in a second direction to generally form a mesh pattern, and each of the compensation electrodes may be arranged in a direction that is parallel with an alignment direction of each of the first sense electrodes.

A display device according to an example embodiment includes: a display portion displaying an image; and a sense portion including at least one of sense electrodes disposed over one side of the display portion and sensing an external input, wherein the sense portion includes a unit sensor capacitor of which a first electrode is electrically connected to a first sense voltage source; and a compensation capacitor of which a first electrode is electrically connected to a compensation voltage source, and the display portion may include: a first transistor including a first gate electrode, a first active layer overlapping the first gate electrode, and a first source electrode and a first drain electrode electrically connected with the first active layer; a second transistor including a second gate electrode, a second active layer overlapping the second gate electrode, and a second source electrode and a second drain electrode electrically connected with the second active layer, wherein the second source electrode is electrically connected to a data line; and a storage capacitor of which a first electrode is electrically connected to the second drain electrode and the first gate electrode, and a light emitting diode electrically connected with the first drain electrode, and a first sense signal applied from the first sense voltage source and a compensation signal applied from the compensation voltage source are inverted in phase.

The display device may further include: an overlapping capacitor of which a first electrode is electrically connected to the sense portion and a second electrode is electrically connected to the display portion; a first point where a second electrode of the unit sensor capacitor and a first electrode of the overlapping capacitor are electrically connected; a second point where a second electrode of the compensation capacitor and the first electrode of the overlapping capacitor are electrically connected; and a third point where the second electrode of the overlapping capacitor and the display portion are electrically connected, wherein a voltage change at the third point is smaller than a predetermined voltage change.

The display device may further include: a display controller that applies a control signal for driving the display portion; and a sense controller that applies a control signal for driving the sense electrode.

The sense controller may apply a control signal to the first sense voltage source and the compensation voltage source.

The compensation voltage source may apply a signal from a first time, and the first sense voltage source applies a signal from a second time.

The sense controller may receive a synchronization signal from the display controller and may control application time of the compensation signal and the first sense signal.

The sense portion may include: at least one of first sense electrodes receiving the first sense signal that is changed in response to the external input; at least one of second sense electrodes disposed at a distance from the first sense electrodes; and at least one of compensation electrodes disposed between the first sense electrodes, and to which the compensation signal is applied.

A display device according to an example embodiment includes: a display portion displaying an image; and a sense portion electrically connected with the display portion at a first node through an overlapping capacitor, the sense portion includes at least one of sense electrodes that sense an external input, wherein the display portion includes: a gate line extending in a first direction; a data line extending in a second direction that is perpendicular to the first direction; and a compensation voltage line that extends in the first direction and is disposed perpendicular to the data line, wherein a compensation signal of which a phase is inverted with respect to a phase of a signal transmitted through the sense portion in the first node is applied to the compensation voltage line.

The compensation voltage line may apply a signal that is delayed compared to a voltage applied to the data line.

The display device may further include: a display controller that applies a control signal for driving the display portion; and a sense controller that applies a control signal for driving the sense electrode, wherein the sense controller may transmit a synchronization signal according to a first sense signal to the display controller, and the display controller may generate the compensation signal.

The display device may further include a third circuit portion that receives a synchronization signal from the display controller and the sense controller, wherein the third circuit portion may generate the compensation signal by reflecting the synchronization signal.

The sense portion may include: at least one of first sense electrodes receiving a first sense signal that is changed in response to the external input; at least one of second sense electrodes disposed at a distance from the first sense electrodes; and at least one of compensation electrodes disposed at a distance from and between the first sense electrodes, and to which the compensation signal is applied.

According to the example embodiments, noise of the display device generated by the operation of the sense electrode can be removed.

Therefore, it is possible to prevent the luminance change of the light emitting diode due to the operation of the sense electrode by removing the noise introduced into the pixel.

BRIEF DESCRIPTION OF THE DRAWINGS

FIG. 10 is a top plan view of a sense electrode according to an example embodiment.

DETAILED DESCRIPTION OF THE EMBODIMENTS

Figure 1A:
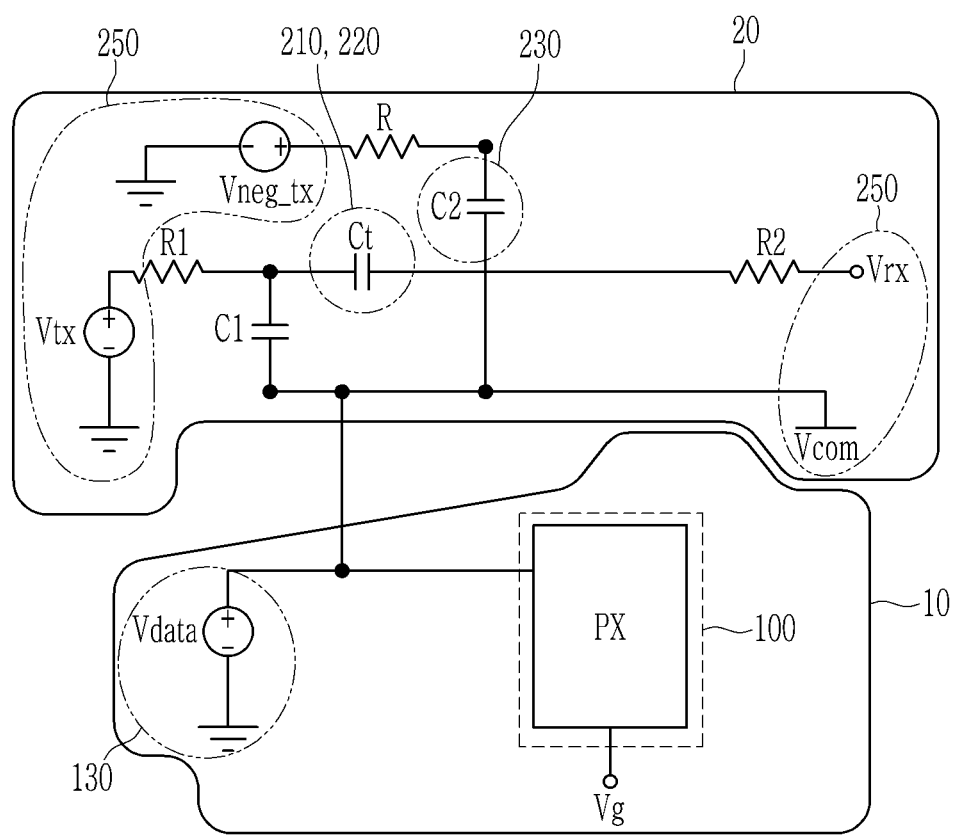
FIG. 1A and FIG. 1B are circuit diagrams of a display device including a sense electrode according to an example embodiment.

The present disclosure will be described more fully hereinafter with reference to the accompanying drawings, in which embodiments of the present disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

Further, in the drawings, size and thickness of each element are arbitrarily represented for better understanding and ease of description, but the present invention is not limited thereto. In the drawings, the thickness of layers, films, panels, regions, etc., are exaggerated for clarity. In the drawing, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

In addition, in the entire specification, when "connected to" is used, it does not only mean that two or more constituent elements are directly connected, but two or more constituent elements may be indirectly connected through other constituent elements, and may be physically or electrically connected, and it is referred to by different names depending on location or function, while it means the whole.

Hereinafter, a display device including a sense electrode will be described with reference to FIG. 1 and FIG. 2.

Figure 1B:
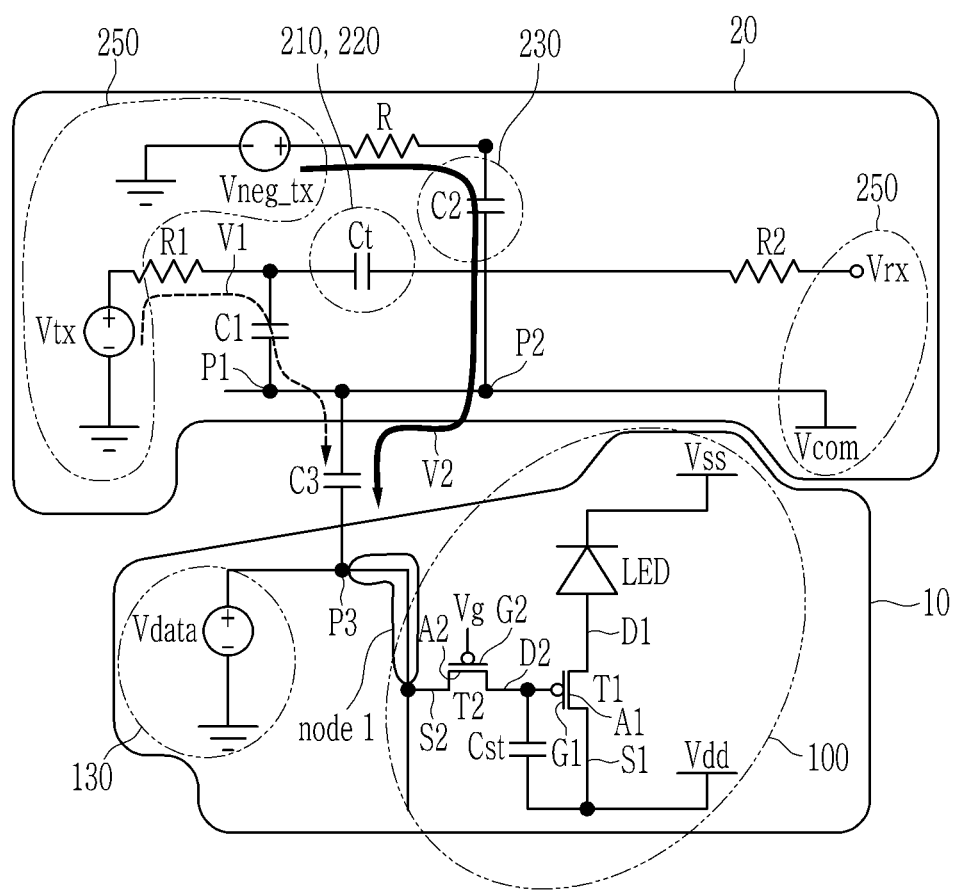
Figure 2:
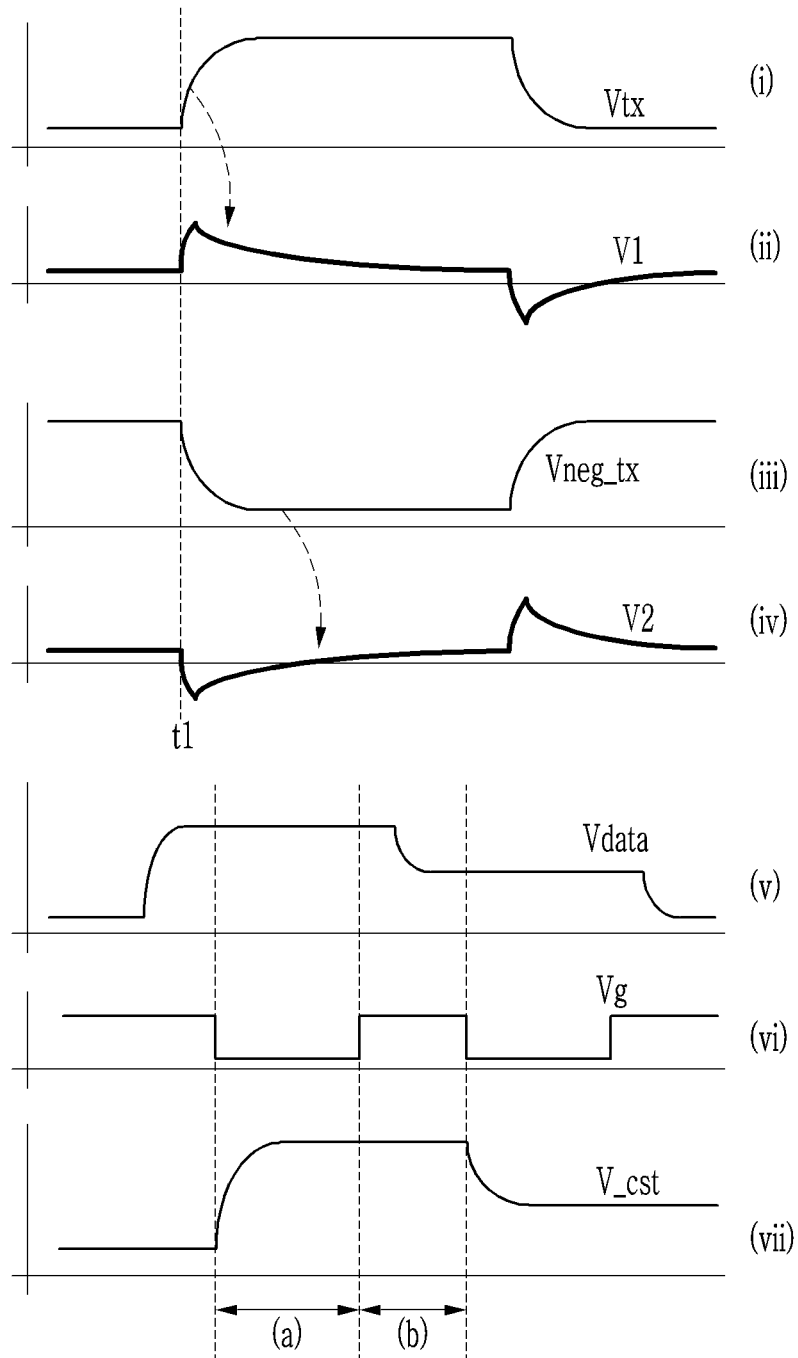
FIG. 2 is a waveform diagram of a voltage applied in the example embodiment shown in FIG. 1A and FIG. 1B.

FIG. 1A and FIG. 1B are circuit diagrams of a display device including a sense electrode according to an example embodiment, and FIG. 2 is a waveform diagram of a voltage applied in the example embodiment shown in FIG. 1A and FIG. 1B.

Referring to FIG. 1A, a display device includes a sense portion 20 that includes a touch sensor and senses an external input, and a display panel 10 that includes a plurality of pixels and displays an image.

The sense portion 20 includes a unit sensor capacitor C1 including a sense electrode, a compensation capacitor C2, and a sense controller 250. In addition, the unit sensor capacitor C1 may include at least one capacitor, and the sense portion 20 may further include a plurality of resistors R. Each capacitor is formed of two capacitor electrodes (i.e., a first electrode and a second electrode), and an insulation layer is disposed between the two capacitor electrodes.

The unit sensor capacitor C1 is electrically connected with the sense controller 250, and may be implemented as a first sense electrode and a second sense electrode, which will be described later. Any external touch is detected through variation of capacitance stored in the unit sensor capacitor C1.

The compensation capacitor C2 is electrically connected to the sense controller 250, and may be implemented as a compensation electrode 230 (refer to FIG. 3A), which will be described later. The compensation capacitor C2 transmits a voltage that removes noise, which may occur due to the unit sensor capacitor C1.

The sense controller 250 includes a first sense voltage source Vtx, a compensation voltage source Vneg_tx, a second sense voltage source Vrx, and a common voltage source Vcom. A sensing capacitor Ct is disposed between the first sense voltage source Vtx and the second sense voltage source Vrx. A first electrode of the sensing capacitor Ct is electrically connected to the first sense voltage source Vtx through a resistor R1, and a second electrode is electrically connected to the second sense voltage source Vrx through a resistor R2. The first electrode of the sensing capacitor Ct may also be called a first sense electrode 210 (refer to FIG. 3A), and the second electrode of the sensing capacitor Ct may also be called a second sense electrode 220 (refer to FIG. 3A). The first sense voltage source Vtx applies a first sense signal of which a voltage fluctuates corresponding to an external input to the first sense electrode, and the second sense voltage source Vrx applies a signal to the second sense electrode. The compensation voltage source Vneg_tx applies a compensation signal that removes noise according to the signal of the first sense voltage source Vtx, and a common voltage source Vcom applies a common signal.

The display panel 10 comprises a display portion 100 including at least one pixel PX, and a data driver 130 including a data voltage source Vdata. The display portion 100 may be implemented as an organic light emitting display device, a light emitting diode display, a quantum dot display, a liquid crystal display, and the like. Although it is not illustrated in FIG. 1A, the display panel 10 may further include a gate driver that applies a gate signal to the display portion, and a display controller that applies a signal for controlling the gate driver and the data driver. The gate driver and the display controller will be described later with reference to FIG. 6A.

The sense portion 20 may be separately formed from the display panel 10 and thus they may overlap each other, or it may be integrally formed with the display panel 10.

Hereinafter, referring to FIG. 1B, a connection relationship between the sense portion 20 and the display panel 10 will be described in detail.

In the sense portion 20, a first electrode of the unit sensor capacitor C1 is electrically connected to the first sense voltage source Vtx through at least one resistor R. In addition, the first electrode of the unit sensor capacitor C1 is electrically connected to a second sense voltage source Vrx through at least one resistor R. The second electrode of the unit sensor capacitor C1 is electrically connected with a first electrode of the compensation capacitor C2. The second electrode of the unit sensor capacitor C1 and a first electrode of an overlapping capacitor C3, which will be described later, are electrically connected at a point which may be called a first point P1.

A first electrode of the compensation capacitor C2 is electrically connected to the compensation voltage source Vneg_tx through at least one resistor R. A second electrode of the compensation capacitor C2 is electrically connected to a common voltage line to which the common voltage Vcom is applied. In addition, as depicted in FIG. 1B, the second electrode of the compensation capacitor C2 is electrically connected to the first electrode of the overlapping capacitor C3. The second electrode of the compensation capacitor C2 and the first electrode of the overlapping capacitor C3 are electrically connected to each other a point which may be called a second point P2. Although it is not illustrated in the drawing, at least one resistor may be provided between the first point P1 and the second point P2, and accordingly, a voltage at the first point P1 and a voltage at the second point P2 may be different from each other. When no resistor exists between the first point P1 and the second point P2, the first point P1 and the second point P2 may be considered as one point having the same voltage.

A pixel of the display portion 100 includes a light emitting diode LED, at least two transistors, and at least one capacitor, and additionally includes the data driver 130 that applies a data voltage to a pixel. Depending on example embodiments, three or more transistors and a plurality of voltage sources may be included in one pixel.

The light emitting diode LED includes a first electrode, which is an anode implemented as a hole injection electrode, a second electrode, which is a cathode implemented as an electron injection electrode, and an emission layer disposed between the first electrode and the second electrode. The second electrode is electrically connected with a driving low voltage line Vss to which a driving low voltage is applied, and the first electrode is electrically connected with the first transistor T1.

The first transistor T1 may be called a driving transistor, and is a transistor that receives a driving voltage Vdd and transmits an output current to the light emitting diode LED according to a voltage of a first gate electrode G1. The first transistor T1 includes the first gate electrode G1, a first active layer A1, a first source electrode S1, and a first drain electrode D1. The first gate electrode G1 is electrically connected with a second electrode of a storage capacitor Cst, and is electrically connected with a second drain electrode D2 of a second transistor T2, which will be described later. The first active layer A1 is disposed to overlap the first gate electrode G1, and the first source electrode S1 and the first drain electrode D1 are respectively electrically connected to opposite ends of the first active layer A1. The first source electrode S1 is electrically connected with the driving voltage line to which the driving voltage Vdd is applied, and the first drain electrode D1 is electrically connected with the anode of the light emitting diode LED. Here, the first transistor T1 may be a P-type transistor, and outputs an output current when a low voltage is applied to the first gate electrode G1. The first source electrode S1 and the first drain electrode D1 can be interchanged.

The second transistor T2 may be called a switching transistor, and is a transistor that transmits a data voltage to the storage capacitor Cst. The second transistor T2 includes a second gate electrode G2, a second active layer A2, a second source electrode S2, and a second drain electrode D2. The second gate electrode G2 is electrically connected to a scan line to which a gate voltage Vg is applied. The second active layer A2 is disposed to overlap the second gate electrode G2, and the second source electrode S2 and the second drain electrode D2 are respectively electrically connected to opposite ends of the second active layer A2. The second source electrode S2 is electrically connected with the data line to which the data voltage is applied, and the second drain electrode D2 is electrically connected with the first gate electrode G1 of the first transistor T1 and the first electrode of the storage capacitor Cst. Here, the second transistor T2 may be a P-type transistor, and is turned on when a low voltage is applied to the second gate electrode G2. Depending on example embodiments, the first and second transistors T1 and T2 may be provided as N-type transistors.

The first electrode of the storage capacitor Cst is electrically connected with the second drain electrode D2 and the first gate electrode G1, and a second electrode of the storage capacitor Cst is electrically connected with the driving voltage line and the first source electrode S1. The storage capacitor Cst may store and maintain a voltage transmitted to the first gate electrode G1 of the first transistor T1 through the second transistor T2.

A first electrode of the overlapping capacitor C3 is electrically connected with the sense portion 20, and a second electrode is electrically connected with a second source electrode S2 of the second transistor T2 and a data voltage source Vdata. Here, a point where the second electrode of the overlapping capacitor C3 and the data voltage source Vdata are electrically connected, that is, at the display portion 100, may be called a third point P3. The data voltage supplied from the data voltage source Vdata may be applied to the second transistor T2 and the like through the third point P3 and the second source electrode S2. The overlapping capacitor C3 representatively shows capacitance that is generated while the display panel 10 and the sense portion 20 overlap each other, and in FIG. 1B, the overlapping capacitor C3 is a representative overlapping capacitor that is generated while wires of the data line and the common voltage line are overlapped. However, other overlapping capacitors may be included. In addition, the overlapping capacitor C3 may be one of parasitic capacitors that are generated when an electrode or a wire of the display panel 10 and an electrode or a wire of the sense portion 20 are overlapped with each other in a vertical direction or a horizontal direction.

In FIG. 1B, the respective capacitors are electrically connected to voltage sources, and capacitance change may occur due to a change in each voltage source. Referring to FIG. 2, (i) denotes a waveform of a voltage applied from the first sense voltage source Vtx, and (ii) denotes a waveform of a voltage V1 at the first point P1, having passed through the unit sensor capacitor C1. (iii) denotes a waveform of a voltage applied from the compensation voltage source Vneg_tx, and (iv) denotes a waveform of a voltage V2 at the second point P2, having passed through the compensation capacitor C2. Here, each voltage waveform may imply a signal waveform.

As shown in (i), when the voltage of the first sense voltage source Vtx is significantly changed, the voltage V1 passing through the first point P1 may be significantly changed. When the voltage of the first sense voltage source Vtx increases, voltages at opposite ends of the unit sensor capacitor C1 increases. Accordingly, a voltage of the overlapping capacitor C3 increases, and a voltage at the third point P3 increases. On the other hand, as shown in (iii), when the voltage of the compensation voltage source Vneg_tx is significantly changed, the voltage V2 passing through P2 may be significantly changed. When the compensation voltage source Vneg_tx decreases, voltages at opposite ends of the compensation capacitor C2 decreases. Accordingly, the voltage of the overlapping capacitor C3 decreases, and the voltage at the third point P3 decreases. Therefore, no voltage change occurs at the point P3. That is, the voltage change may be insignificant compared to a predetermined voltage change at the third point P3. The predetermined voltage change may be a voltage change at the third point P3 when no signal from the compensation voltage source Vneg_tx is applied. The voltage change at the third point P3 may decrease by a signal applied from the compensation voltage source Vneg_tx, but the voltage at the third point P3 may be changed according to the size of each capacitor, and thus, the sense controller 250 may apply a compensation signal that minimizes the voltage change due to the first sense signal, considering the size of each capacitor.

Specifically, the sense controller 250 applies a compensation signal having an inverted phase of that of a first sense signal of the first sense voltage source Vtx, to the compensation voltage source Vneg_tx. Accordingly, the voltage V1 having passed through the unit sensor capacitor C1 and the overlapping capacitor C3 and the voltage V2 having passed through the compensation capacitor C2 and the overlapping capacitor C3 are inverted in phase at the point P3 such that the voltage V1 and the voltage V2 are offset. Here, when the first sense signal and the compensation signal are the same in magnitude, no voltage change occurs at the third point P3, but when the first sense signal and the compensation signal are similar to each other in magnitude, a partial voltage change may occur at the third point P3.

That is, noise, which may occur when the first sense signal S_tx is coupled with the unit sensor capacitor C1 and the overlapping capacitor C3, may be weakened at a first node (node 1) including the third point P3. Thus, since an insignificant voltage change occurs in the first node (node 1), the data voltage supplied from the data voltage source Vdata may be directly applied to a pixel circuit. In addition, the noise, which may occur when the first sense signal S_tx is coupled with the unit sensor capacitor C1 and the overlapping capacitor C3, is removed at the first node (node 1) such that the data voltage supplied from the data voltage source Vdata may be directly applied to the pixel circuit.

(v) denotes a voltage applied from the data voltage source Vdata, and (vi) denotes a gate voltage applied to the second gate electrode. A waveform of a voltage at the storage capacitor Cst according to (v) and (vi) is shown in (vii).

When a low voltage (i.e., a gate-on voltage) is applied to the second gate electrode in (a), the second transistor T2 is turned on and a second source electrode and a second drain electrode of the second transistor T2 are electrically connected. In this case, the data voltage that started to be written in before the section (a) is stored in the first electrode of the storage capacitor Cst through the second transistor T2. In addition, when a voltage that is the same as the voltage applied to the storage capacitor Cst is applied to the first gate electrode and thus a voltage over a threshold voltage Vth of the first transistor T1 is applied, the first transistor T1 is turned on. The first transistor T1 sets intensity of a current output according to a voltage difference between the driving voltage Vdd applied from the first source electrode and a voltage at one end of the storage capacitor Cst.

Next, since the second transistor T2 is in a turned-off state by a high voltage in the section (b), a current output from the first transistor T1 is transmitted to the light emitting diode LED, and luminance of light emitted from the light emitting diode LED is determined according to the intensity of the current. Although the data voltage decreases in the section (b), the voltage stored in the first electrode of the storage capacitor Cst is constantly maintained because the second transistor T2 is in the turned-off state.

That is, luminance displayed by the light emitting diode LED is determined according to the intensity of the current flowing through the light emitting diode LED. The current flowing through the light emitting diode LED is an output current of the first transistor T1, and thus the output current is changed according to a voltage of the first gate electrode of the first transistor T1. Therefore, the display device can adjust luminance of the light emitting diode LED by controlling the voltage of the first gate electrode of the first transistor T1. The voltage of the first gate electrode of the first transistor T1 can be determined by the data voltage, and thus the display device can adjust luminance of the light emitting diode LED by adjusting the data voltage.

Accordingly, in the display device according to the example embodiment, noise introduced into the pixel is removed and thus luminance change of a light emitting pixel according to operation of the sense electrode can be prevented.

Hereinafter, referring to FIG. 3A, FIG. 3B, FIG. 4A, and FIG. 4B, the sense portion including the sense electrode will be described.

Figure 3A:
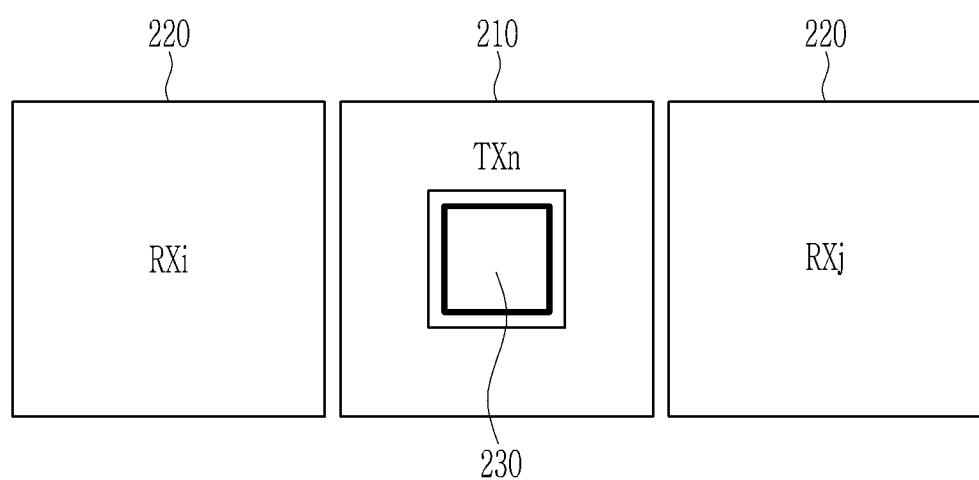
FIG. 3A is a schematic layout view of the sense electrode according to the example embodiment.
Figure 3B:
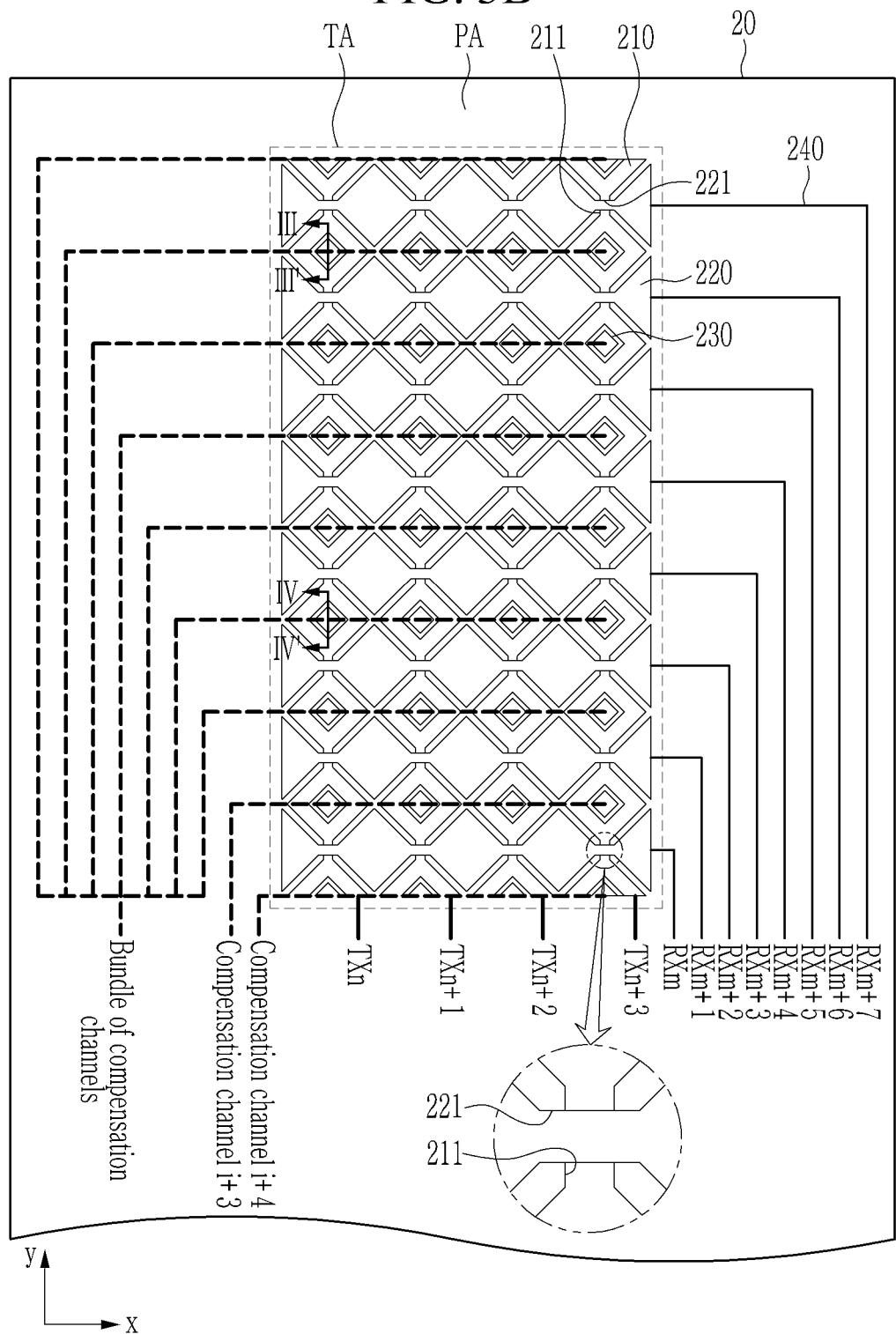
FIG. 3B is a schematic top plan view of the sense electrode according to the example embodiment.
Figure 4A:
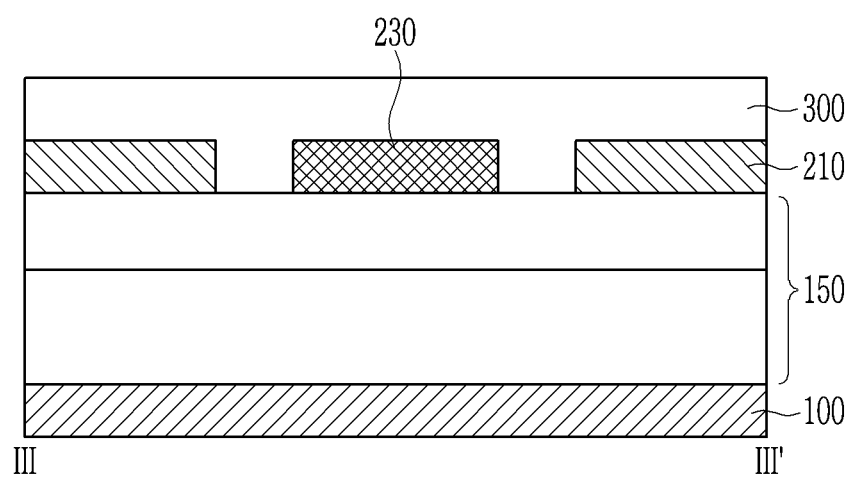
FIG. 4A is a cross-sectional view of FIG. 3B, taken along line III-III'.
Figure 4B:
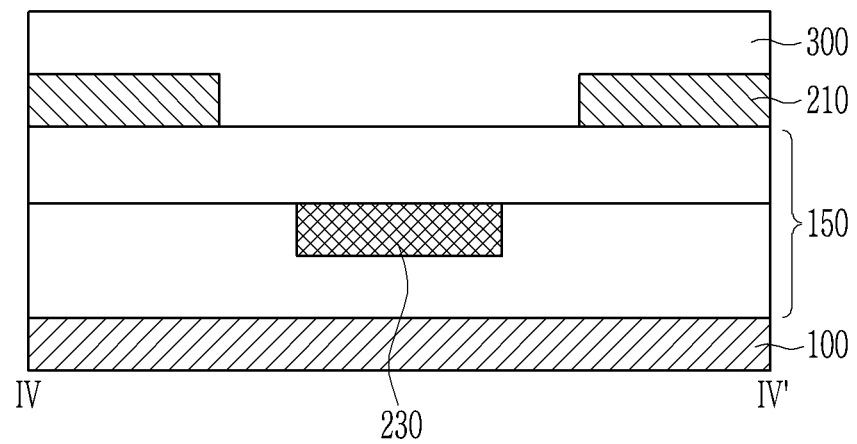
FIG. 4B is a cross-sectional view of FIG. 3B, taken along line IV-IV.

FIG. 3A is a schematic layout view of the sense electrode according to the exemplary embodiment, FIG. 3B is a schematic top plan view of the sense electrode according to the example embodiment, FIG. 4A is a cross-sectional view of FIG. 3B, taken along line III-III', and FIG. 4B is a cross-sectional view of FIG. 3B, taken along line IV-IV'.

Referring to FIG. 3A and FIG. 3B, the sense portion 20 includes a plurality of sense electrodes and a plurality of compensation electrodes 230, and the plurality of sense electrodes include a plurality of first sense electrodes 210 and a plurality of second sense electrodes 220.

The first sense signal S_tx changed corresponding to an external input may be applied to the first sense electrode 210. A compensation signal neg_tx for compensation of the noise according to the first sense signal S_tx may be applied to the compensation electrode 230. The first sense electrode 210 is a sensing input (Tx) electrode, and the second sense electrode 220 may be a sensing output (Rx) electrode. In addition, the first sense electrode 210 may be a sensing output (Rx) electrode and the second sense electrode 220 may be a sensing input (Tx) electrode.

Referring to FIG. 3A, the first sense electrode 210 is disposed between two second sense electrodes 220, while having a distance therebetween. A single compensation electrode 230 is disposed at a distance from and within a single first sense electrode 210. That is, edges of the compensation electrode 230 are surrounded by the first sense electrode 210.

The compensation electrode 230 may not be disposed between the first sense electrode 210 and the second sense electrode 220, and may be disposed only between a plurality of first sense electrodes 210, while being spaced apart from the first sense electrodes 210. The compensation electrode 230 may be positioned to be as far as possible from the second sense electrode 220.

Referring to FIG. 3B, the sense portion 20 includes a touch area TA where the plurality of sense electrodes are disposed, and a peripheral area PA that surrounds the touch area TA.

The touch area TA includes a plurality of sense electrodes and a plurality of compensation electrodes 230, and a plurality of first sense electrodes 210, a plurality of second sense electrodes 220, and a plurality of compensation electrodes 230.

The plurality of first sense electrodes 210 and the plurality of second sense electrodes 220 are dispersed and thus arranged in a mesh format such that they do not overlap each other. The plurality of first sense electrodes 210 are arranged in plural along a second direction y or a first direction x, and the plurality of second electrodes 220 are arranged in plural along the second direction y or the first direction x.

A plurality of first sense electrodes 210 arranged in each column are electrically connected with each other through a first connector 211, and a plurality of second sense electrodes 220 arranged in each row are electrically connected with each other through a second connector 221.

The plurality of compensation electrodes 230 are respectively disposed at a distance from and within the plurality of first sense electrodes 210, and are disposed to be parallel with the second direction y and the first direction x, respectively. The plurality of compensation electrodes 230 are arranged in the first direction x that crosses the second direction y in which the plurality of first sense electrodes 210 are arranged. Depending on exemplary embodiments, the plurality of compensation electrodes 230 may be arranged in a direction that is parallel with a direction in which the plurality of first sense electrodes 210 are arranged. An alignment direction of sense wires 240 may be changed depending on an alignment direction of the plurality of compensation electrodes 230.

The plurality of sense electrodes and the plurality of compensation electrodes 230 are illustrated in the shape of a rhombus, but this is not restrictive. For example, the shape may be a polygon, a quadrangle, a hexagon, or an oval, and may be implemented in various shapes such as having a protruding portion to improve the sensitivity of the sensor.

A plurality of sense wires 240 electrically connected to the plurality of sense electrodes and the plurality of compensation electrodes 230 are disposed in the peripheral area PA. The plurality of compensation electrodes 230 arranged in the same first direction x may be electrically connected by a plurality of compensation sense wires extending in the first direction x. Although it is not illustrated in FIG. 3B, the plurality of sense wires 240 may be electrically connected to a pad portion (not shown) of the display device. In this case, the plurality of sense wires 240 may be respectively directly and electrically connected to the pad portions, or some of the sense wires are electrically connected with each other and then electrically connected to the pad portion through a single wire. The plurality of sense wires 240 are disposed in a different layer from that of the pad portion, and thus may be electrically connected with the pad portion through an opening of an insulation layer disposed between the plurality of sense wires 240 and the pad portion. In addition, the plurality of sense wires 240 may be continuously formed of the same material as the plurality of first and second sense electrodes 210 and 220. That is, portions partially extending from the plurality of first and second sense electrodes 210 and 220 may be implemented as the plurality of sense wires 240.

A compensation signal may be applied to the plurality of sense wires (compensation channel i+3, compensation channel i+4, bundles of compensation channels) electrically connected to the plurality of compensation electrodes 230. A plurality of sense wires TXn, TXn+1, TXn+2, and TXn+3 electrically connected to the plurality of first sense electrodes 210 may be applied with a first sense signal. In addition, a plurality of sense wires RXm, RXm+1, RXm+2, RXm+3, RXm+4, RXm+5, RXm+6, and RXm+7 electrically connected to the plurality of second sense electrodes 220 may be applied with a second sense signal.

The first sense electrode 210 and the second sense electrode 220 are disposed over the same layer, but may be disposed over different layers. In addition, the compensation electrode 230 may be positioned over the same layer as the first sense electrode 210, or may be positioned over different layers.

Referring to FIG. 4A, the sense portion is positioned over one side of the display portion 100, while overlapping the display portion 100. A single or a plurality of insulation layers 150 is disposed between the sense portion and the display portion 100. A window 300 may be disposed over the sense portion.

In the sense portion, two first sense electrodes 210 and the compensation electrode 230 are positioned over the same layer. A single compensation electrode 230 is disposed at a distance from the two adjacent first sense electrodes 210.

That is, the compensation electrode 230 is positioned only between the first sense electrodes 210 and disposed as far as possible from the second sense electrode 220, and thus may not affect capacitance formed between the first sense electrode 210 and the second sense electrode 220. That is, driving of the sense portion 20 is not influenced.

Referring to FIG. 4B, in the sense portion, the compensation electrode 230 is disposed over a different layer from the first sense electrode 210. The compensation electrode 230 may be disposed to not overlap the first sense electrodes 210 while disposing the insulation layer 150 therebetween.

That is, the compensation electrode 230 is disposed between two first sense electrodes 210, and opposite ends of the compensation electrode 230 may be disposed at a distance so as to not overlap one end of one first sense electrode 210 in a vertical direction.

Since the compensation electrode 230 is disposed only between the adjacent first sense electrodes 210 in FIG. 4B, the compensation electrode 230 is disposed to be as far as possible from the second sense electrode 220 such that it may not affect the capacitance formed between the first sense electrode 210 and the second sense electrode 220.

Hereinafter, referring to FIG. 5, a display device that includes a sense portion that can more reduce power consumption than the above-described display device will be described.

Figure 5:
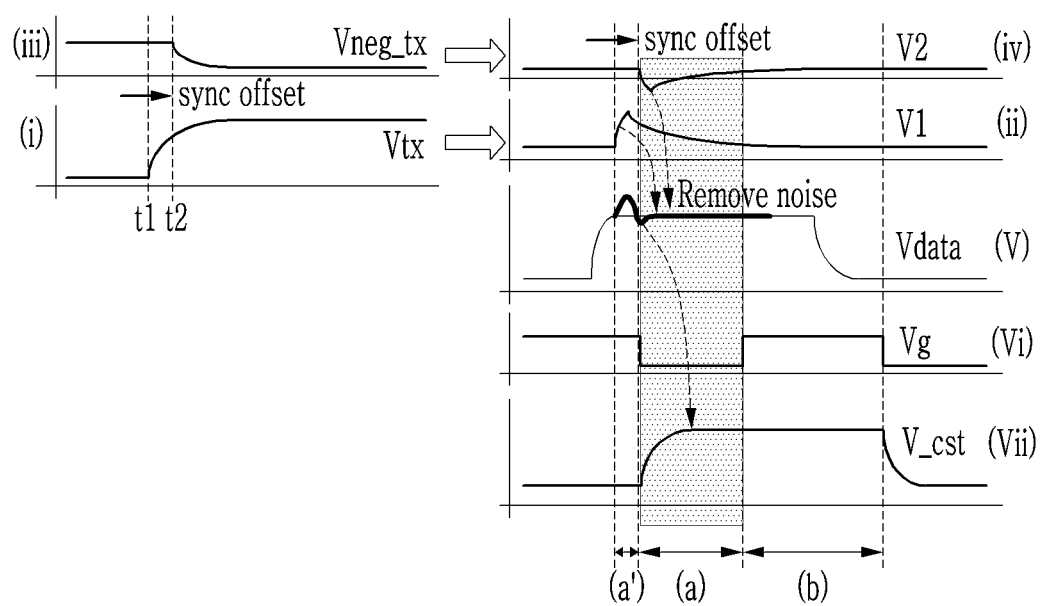
FIG. 5 is a waveform of a voltage applied to a display device according to an example embodiment.

FIG. 5 is a waveform of a voltage applied to a display device according to an example embodiment. The waveform of FIG. 5 will be described with reference to the circuit diagram of FIG. 1 and the waveform of FIG. 2.

(i) is a waveform of a voltage applied from a first sense voltage source Vtx, and (iii) is a waveform of a voltage applied from a compensation voltage source Vneg_tx. Accordingly, a voltage at an overlapping capacitor C3 may have a waveform as shown in (ii), and a voltage at a storage capacitor Cst may have a waveform as shown in (iv). A voltage applied from a data voltage source Vdata has a waveform shown in (v), and a gate voltage applied from a second gate electrode has a waveform of (vi). Accordingly, a voltage of the storage capacitor Cst has a waveform of (vii).

Referring to (i) and (iii) of FIG. 2, the first sense voltage source Vtx and the compensation voltage source Vneg_tx start to apply voltages at the same timing.

On the other hand, referring to (i) and (iii) of FIG. 5, the compensation voltage source Vneg_tx starts to apply a signal at a first time t1, but the first sense voltage source Vtx starts to apply a signal at a second time t2. The signals applied from the compensation voltage source Vneg_tx and the first sense voltage source Vtx have different time points, but the phases are opposite to each other, while the magnitudes are substantially equal to or similar.

Referring to (ii) and (iv) of FIG. 5, a voltage V1 passed through a unit sensor capacitor C1 in the section (a) may have a phase that is opposite to a phase of a voltage V2 passed through a compensation capacitor C2, and the voltage V1 and the voltage V2 may be different in magnitude. Accordingly, no voltage change occurs in the first node (node 1) of FIG. 1.

When a low voltage is applied to a second gate electrode G2 in the section (a), the second transistor T2 is turned on and transmits a data voltage. A first electrode of the storage capacitor Cst and a first gate electrode G1 are applied with constant voltages, and thus the first gate electrode G1 is turned on.

Next, in the section (b), the second transistor T2 is in a turned-off state by a high voltage, and thus a current output from the first transistor T1 is transmitted to a light emitting diode LED, and luminance of light emitted from the light emitting diode LED is determined according to intensity of the current. Although the data voltage is decreased in the section (b), a voltage stored in the first electrode of the storage capacitor Cst is maintained constantly because the second transistor T2 is in the turned-off state.

That is, although the first sense signal and the compensation signal have different application timing, the intensity of the current flowing to the first transistor T1 and luminance of the light emitting diode LED are hardly affected. In addition, in the section (a'), the compensation signal neg_tx is not applied and thus power consumption due to the compensation voltage source Vneg_tx in the section (a') can be prevented in the display device. Accordingly, when the voltages area applied according to the waveforms shown in FIG. 5, power consumption can be saved compared to power consumption according to the waveforms shown in FIG. 2.

Hereinafter, referring to FIG. 6A and FIG. 6B, a controller that controls a display panel and a sense portion will be described.

Figure 6A:
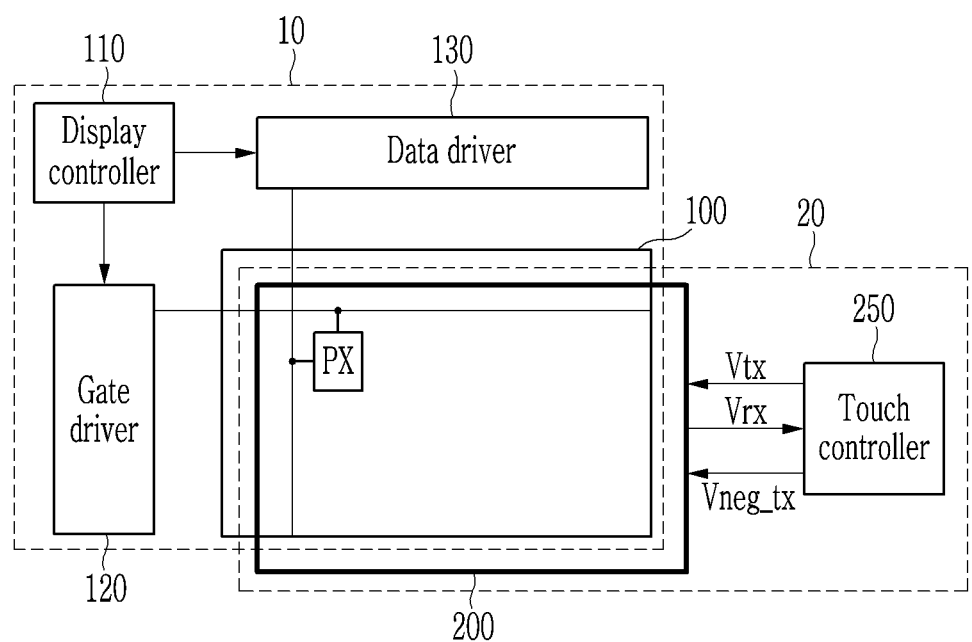
FIG. 6A and FIG. 6B are block diagrams for description of a voltage applied to a display device according to an present embodiment.
Figure 6B:
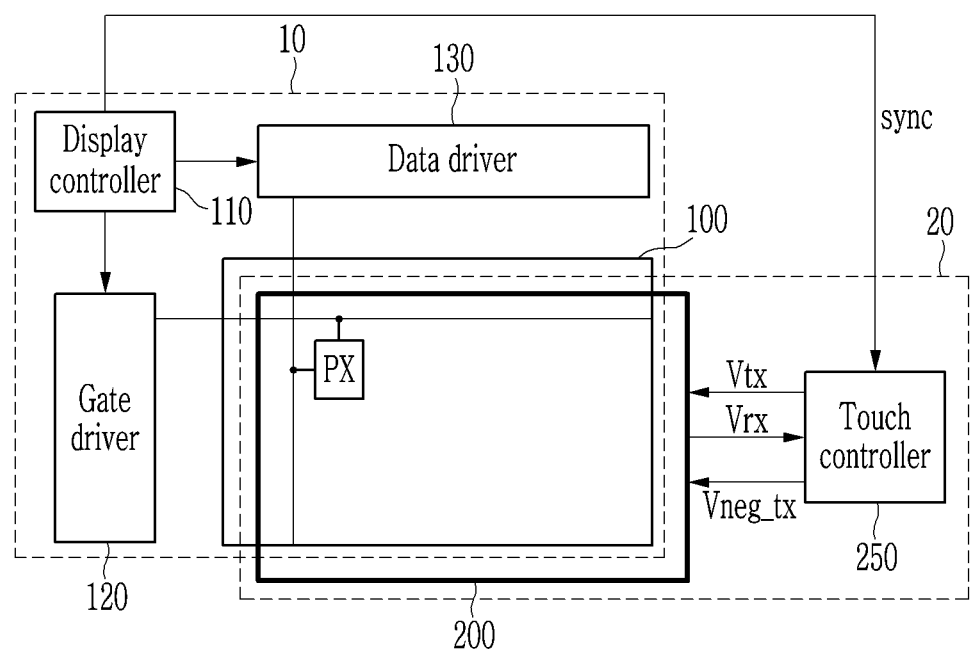

FIG. 6A and FIG. 6B are block diagrams for description of a voltage applied to a display device according to an example embodiment.

Referring to FIG. 6A and FIG. 6B, a display panel 10 includes a display controller 110, agate driver 120, and a data driver 130 for driving a display portion 100. A sense portion 20 includes a plurality of sense electrodes 200, and a sense controller 250 that drives the plurality of sense electrodes 200.

The display controller 110 receives image data and a synchronization signal from an external source (not shown), and transmits the received data and signal to the gate driver 120 and the data driver 130. The gate driver 120 receives a gate driving control signal and generates a gate signal, and may apply the gate signal to the display portion 100 through a gate line. The data driver 130 receives a data driving control signal and generates a data signal, and may apply the data signal to the display portion 100 through a data line.

The sense electrodes 200 may include the plurality of first and second sense electrodes 210 and 220 and the plurality of compensation electrodes 230 described above with references to FIG. 3A to FIG. 4B. In addition, the sense electrodes 200 may include at least a part of the sense wires 240 electrically connected to the plurality of first and second sense electrodes 210 and 220 and the plurality of compensation electrodes 230.

The sense controller 250 applies a control signal to the plurality of sense electrodes 200. In this case, the control signal includes a first touch control signal for driving the first sense electrode 210, and a second touch control signal for driving the second sense electrode 220. In FIG. 6A and FIG. 6B, Vtx may imply the first touch control signal, and Vrx may imply the second touch control signal, but may also correspond to the first sense signal and the second sense signal, and thus the same reference numerals are used.

Referring to FIG. 6A, the sense controller 250 further applies a compensation signal for driving of the compensation electrode 230 to the plurality of sense electrode portions 200. In FIG. 6A, Vneg_tx corresponds to a compensation control signal, but may also correspond to the compensation signal, and thus the same reference numeral is used.

The compensation signal neg_tx and the first sense signal S_tx are opposite to each other in phase, and they are the same or similar to each other in magnitude.

The sense controller 250 may directly generate the compensation signal neg_tx to correspond to the first sense signal S_tx, and thus the compensation signal can be simply synchronized.

Referring to FIG. 6B, the display controller 110 transmits a synchronization signal sync that relates to timing at which a pixel PX can be driven according to a scan signal applied to a second gate electrode of a second transistor T2 and a data voltage applied to a second electrode, to the sense controller 250. The sense controller 250 receives the synchronization signal sync from the display controller 110 and generates the compensation signal neg_tx.

The compensation signal neg_tx generated from the sense controller 250 may have an opposite phase to the phase of the first sense signal S_tx, and may have the same or similar magnitude. However, the sense controller 250 synchronizes timing according to the application of the gate signal in order to control application timing of the compensation signal neg_tx and application timing of the first sense signal S_tx. The controller shown in FIG. 6B may apply a voltage having a similar waveform to the waveform shown in FIG. 5. As described with reference to FIG. 5, the display device according to the present example embodiment can reduce power consumption of the sense portion.

The compensation signal neg_tx generated by the sense controller 250 may be applied to the compensation electrode 230. Accordingly, although noise is generated due to coupling of the first sense signal S_tx, the noise introduced into the data line can be removed by the compensation signal neg_tx, and thus the display device according to the present example embodiment can prevent luminance change of a light emitting element according to operation of the sense electrode.

Hereinafter, referring to FIG. 7, 8, 9A, 9B, 9C, and FIG. 10, various example embodiments of a sense electrode will be described.

Figure 7:
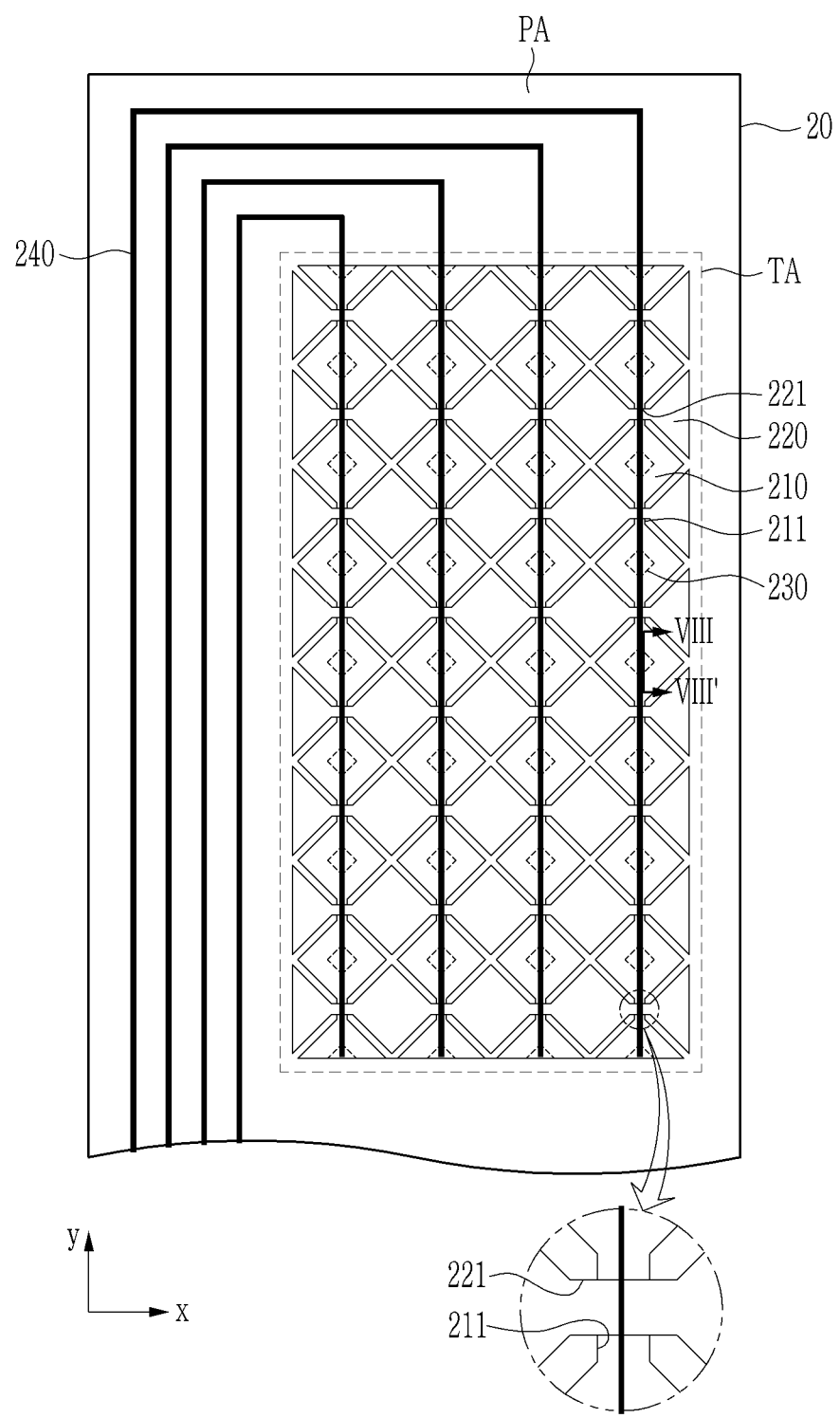
FIG. 7 is a top plan view of a sense electrode according to an example embodiment.
Figure 8:
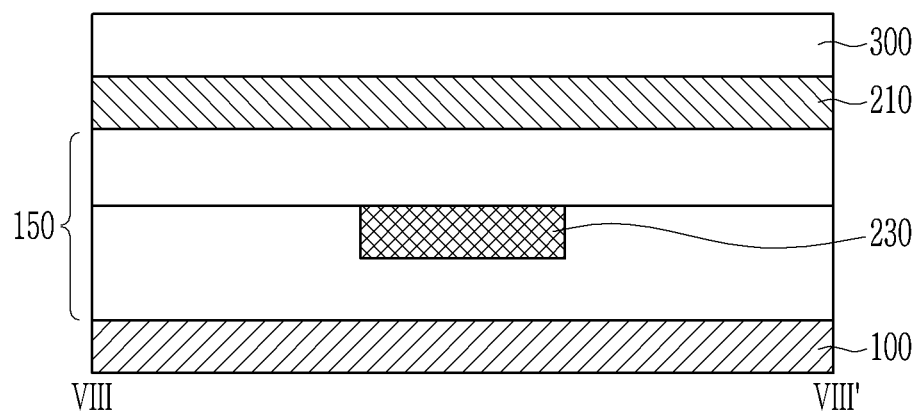
FIG. 8 is a cross-sectional view of FIG. 7, taken along line VIII-VIII'.
Figure 9A:
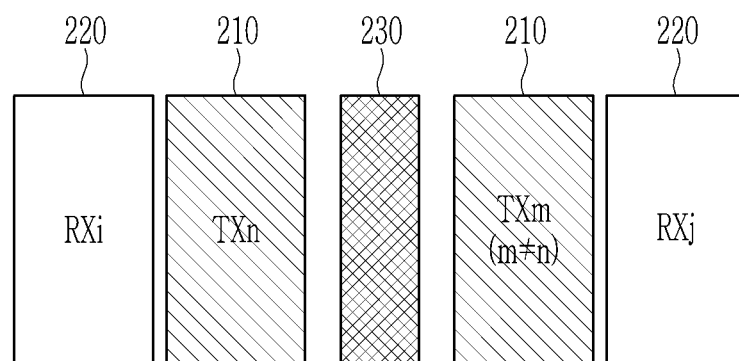
FIG. 9A, FIG. 9B, and FIG. 9C are schematic layout views of a sense electrode according to an example embodiment.
Figure 9B:
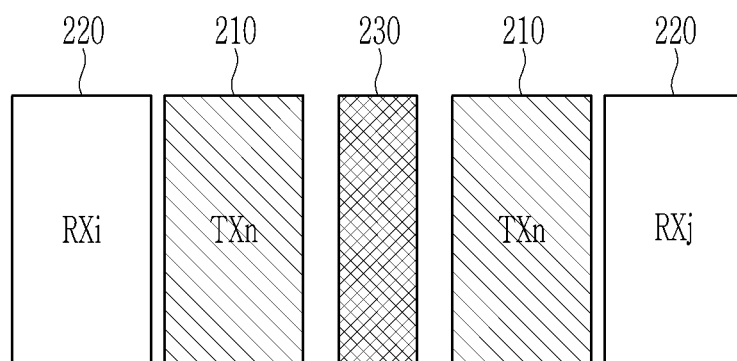
Figure 9C:
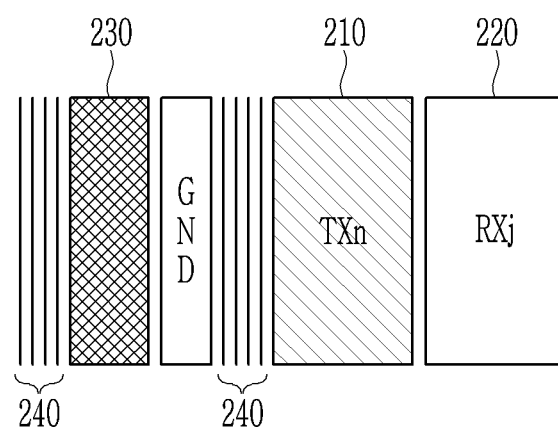

FIG. 7 is a top plan view of a sense electrode according to an example embodiment, FIG. 8 is a cross-sectional view of FIG. 7, taken along line VIII-VIII', FIG. 9A, FIG. 9B, and FIG. 9C are schematic layout views of a sense electrode according to an example embodiment, and FIG. 10 is a top plan view of a sense electrode according to an example embodiment.

Referring to FIG. 7 and FIG. 8, a sense portion 20 comprises a plurality of sense electrodes and a plurality of compensation electrodes 230, and the plurality of sense electrodes include a plurality of first sense electrodes 210 and a plurality of second sense electrodes 220. FIG. 7 and FIG. 8 are similar to FIG. 3B, FIG. 4A, and FIG. 4B, and thus only differences will be mainly described hereinafter.

The plurality of compensation electrodes 230 overlap the plurality of first sense electrodes 210 and are disposed inside the plurality of first sense electrodes 210. In a cross-sectional view, the compensation electrode 230 overlaps the first sense electrode 210, while being disposed over a different layer from the first sense electrode 210. The second sense electrode 220 may be disposed over the same layer as the first sense electrode 210, or may be disposed over a different layer. The compensation electrode 230 may be formed smaller than the first sense electrode 210.

The plurality of compensation electrodes 230 arranged in the same second direction y may be electrically connected by a plurality of compensation wires 240 extending in the second direction y. In this case, each of the compensation electrodes 230 may be applied with a compensation signal neg_tx. Here, the compensation signal neg_tx is a signal having the same or similar intensity to the first sense signal S_tx applied to the first sense electrode 210, but with a different phase.

The compensation electrode 230 is disposed farther away from the second sense electrode 220 than the first sense electrode 210, and thus the compensation electrode 230 may not affect capacitance formed between the first sense electrode 210 and the second sense electrode 220. That is, driving of the sense portion 20 is not affected.

Referring to FIG. 9A and FIG. 9B, the sense portion 20 includes a plurality of sense electrodes and a plurality of compensation electrodes 230, and the plurality of sense electrodes include a plurality of first sense electrodes 210 and a plurality of second sense electrodes 220. FIG. 9A is similar to FIG. 3A, and only differences will be mainly described.

Referring to FIG. 9A, two first sense electrodes 210 are disposed between two second sense electrodes 220, and the compensation electrode 230 is disposed between the two first sense electrodes 210. In this case, with reference to the compensation electrode 230, the left first sense electrode 210 (TXn) and the right first sense electrode 210 (TXm) are electrically connected by different sense wires 240 (not shown in FIG. 9A) and thus may receive different signals.

Referring to FIG. 9B, two first sense electrodes 210 are disposed between two second sense electrodes 220, and a compensation electrode 230 is disposed between the two first sense electrodes 210. In this case, with reference to the compensation electrode 230, the left first sense electrode 210 (TXn) and the right first sense electrode 210 (TXn) may be electrically connected by the same sense wire 240 (not shown in FIG. 9B) and thus receive the same signal.

Referring to FIG. 9C, a compensation electrode 230 is disposed at one side of a first sense electrode 210, and a ground power source GND and a plurality of sense wires 240 are disposed between the compensation electrode 230 and the first sense electrode 210. A second sense electrode 220 is disposed at the other side of the first sense electrode 210. In FIG. 9C, one first sense electrode 210 and one second sense electrode 220 are illustrated, but another first sense electrode 210 may be disposed at the left side of the plurality of wires 240 disposed at the left side with reference to the compensation electrode 230 and another second sense electrode 220 may be disposed at the left side of the first sense electrode 210.

That is, the compensation electrode 230 is disposed only between the first sense electrodes 210, while being disposed to be as far as possible from the second sense electrode 220, such that it may not affect the capacitance formed between the first sense electrode 210 and the second sense electrode 220.

Referring to FIG. 10, a plurality of first sense electrodes 210 is provided in plural in a second direction y, and at least two second sense electrodes 220 are provided in the second direction y.

The plurality of first sense electrodes 210 are disposed in the second direction y between at least the two second sense electrodes 220, and compensation electrodes 230 are disposed in the second direction y between adjacent first sense electrodes 210.

One compensation electrode 230 is disposed at a distance between two first sense electrodes 210 disposed in the first row, and another compensation electrode 230 is disposed at a distance between four first sense electrodes 210 disposed in the second and third rows. The compensation electrode 230 is disposed at a distance between the first sense electrodes 210, and the shape and the size of the compensation electrode 230 may be variously implemented.

A plurality of sense wires 240 electrically connected to the plurality of first sense electrodes 210 are disposed between the first sense electrodes 210 and the second sense electrodes 220. The plurality of sense wires 240 extend in the second direction y, and even through it is not illustrated in FIG. 10, the plurality of sense wires 240 may be respectively electrically connected to the plurality of second sense electrodes 220 and the plurality of compensation electrodes 230.

A plurality of sense wires 240 electrically connected to the plurality of compensation electrodes 230 may be applied with a compensation voltage. A plurality of first sense electrodes 210 electrically connected to the plurality of sense wires 240 may be applied with a first sense electrode 210.

In the example embodiments, the compensation electrode 230 is disposed only between the first sense electrodes 210 and disposed to be as far as possible from the second sense electrode 220, and thus it may not affect the capacitance formed between the first sense electrode 210 and the second sense electrode 220.

Hereinafter, referring to FIG. 11 and FIG. 12, a display device including a compensation voltage line will be described.

Figure 11:
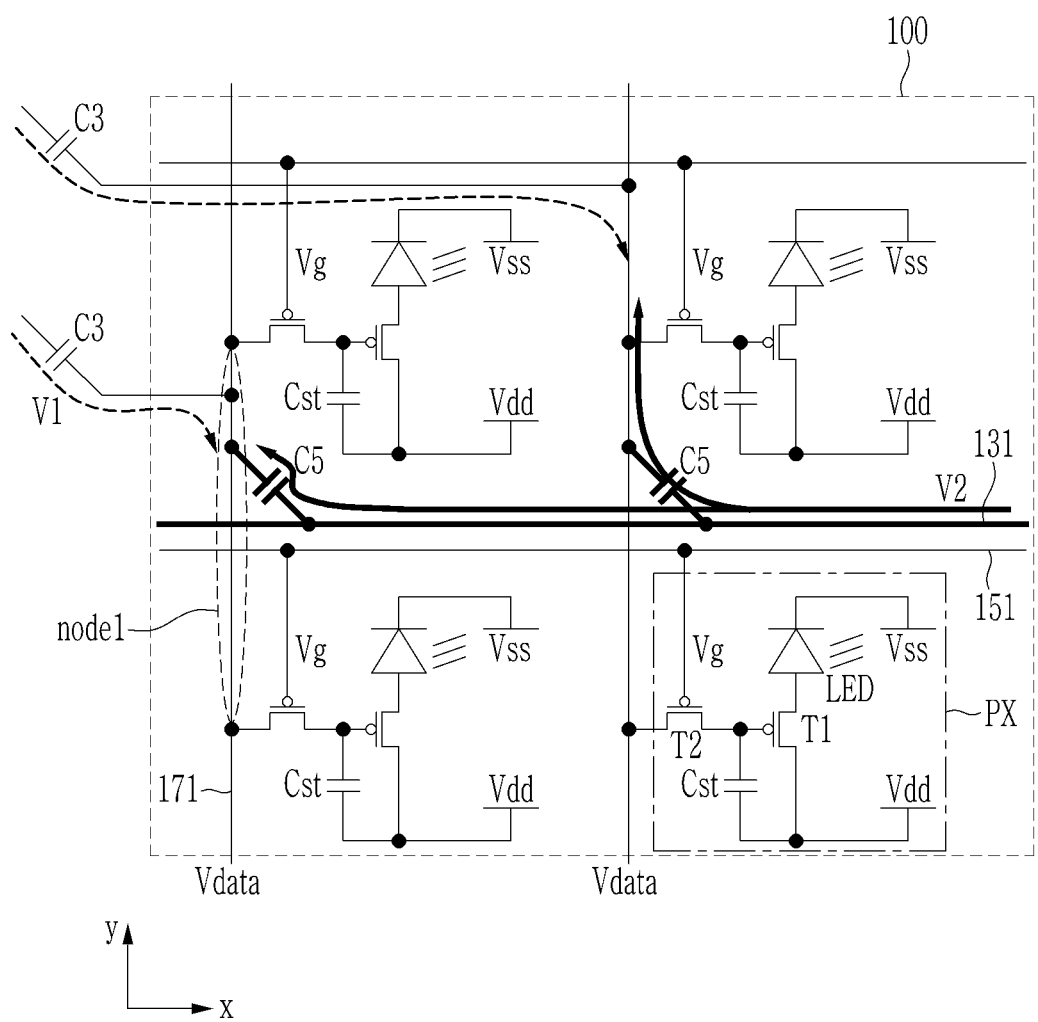
FIG. 11 is a top plan view of a sense electrode according to an example embodiment.
Figure 12:
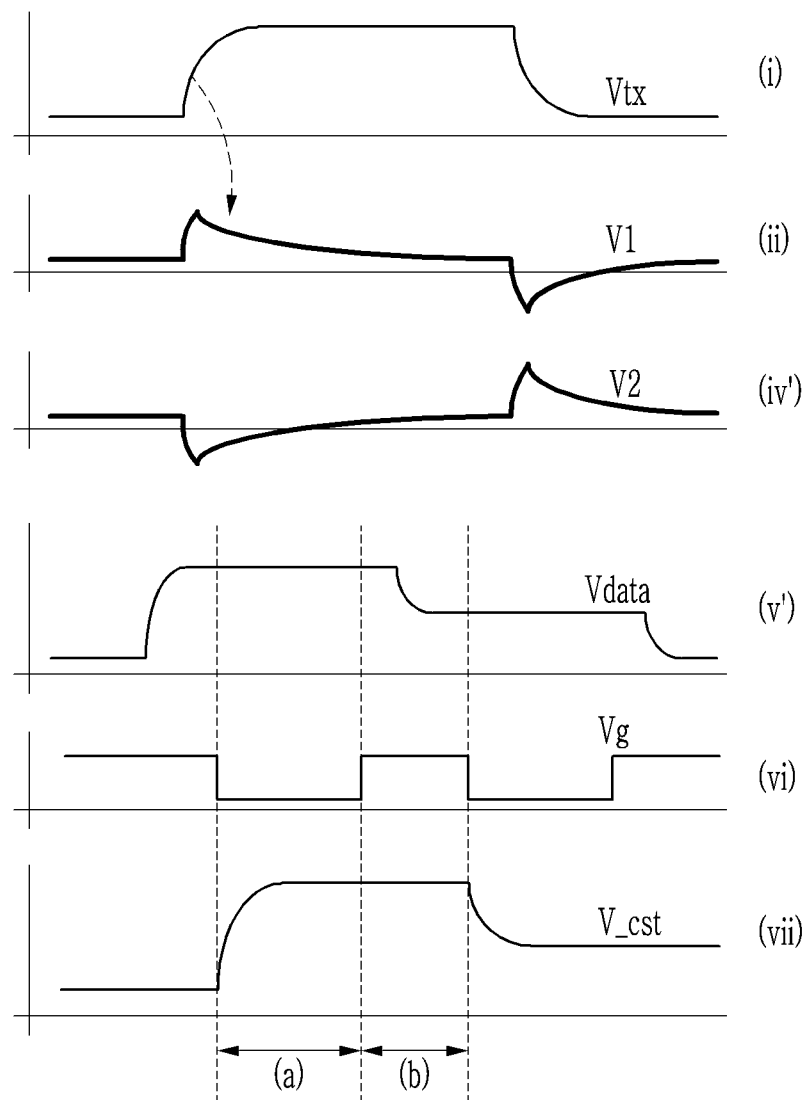
FIG. 12 is a waveform diagram of a voltage applied to the display device in the example embodiment shown in FIG. 11.

FIG. 11 is a circuit diagram of a display device according to an example embodiment, and FIG. 12 is a waveform diagram of a voltage applied to the display device in the example embodiment shown in FIG. 11. Since the circuit diagram of FIG. 11 and the waveform of FIG. 12 are similar to the circuit diagram and the waveform described with reference to FIG. 1B and FIG. 2, the description will focus on the differences.

Referring to FIG. 11, a display device includes a display portion 100 including a plurality of pixels.

Although a sense portion 20 is not illustrated in FIG. 11, the display portion 100 and the sense portion 20 may be electrically connected to each other by an overlapping capacitor C3. Noise due to operation of the sense portion 20 may be transmitted to the display portion 100 by the overlapping capacitor C3.

The display portion 100 includes gate lines 151, data lines 171, compensation voltage lines 131, and a plurality of pixels PX, and each pixel PXL includes a light emitting diode LED, two transistors, and a storage capacitor Cst. Here, the two transistors may be respectively called a first transistor T1 and a second transistor T2.

As depicted in FIG. 11, the gate line 151 may extend in a first direction x, and the data line 171 may extend in a second direction y that is perpendicular to the first direction x. The compensation voltage line 131 may extend in the first direction x that is parallel with the gate line 151, and may be disposed in a direction perpendicular to the data line 171. The gate line 151 is applied with a scan signal Sn, and thus may be called a scan line.

A second gate electrode of the second transistor T2 is electrically connected to the gate line 151, and a second electrode of the second transistor T2 is electrically connected to the data line 171. A point where the second electrode and the data line 171 are electrically connected may be called a first node (node 1). The data line 171 and the compensation voltage line 131 are electrically connected to each other at the first node (node 1). In addition, one electrode of the overlapping capacitor C3 is electrically connected to the first node (node 1).

A parasitic capacitor C5 is formed between the compensation voltage line 131 and the data line 171. Accordingly, no additional capacitor needs to be formed between the compensation voltage line 131 and the data line 171.

Depending on example embodiments, a display device may not include a separate compensation voltage line 131, and may apply a compensation signal when a light emission control signal, an initialization signal, and the like, which are applied in the first direction x, is not written. In addition, since the noise due to the sense portion 20 is very small, there is no need of arranging the compensation voltage line 131 in each pixel, and the number and the position of the compensation voltage lines 131 may be variously modified.

Referring to FIG. 12, (i) is a waveform of a voltage applied from the sense portion 20, (ii) is a waveform of a voltage V1 at the first node (node 1), and (iv') is a waveform of a voltage V2 applied from the compensation voltage line 131. A voltage having a waveform of (v') is applied from the data line 171 when a voltage having a waveform of (vi) is applied from the gate line 151, and a voltage at the storage capacitor Cst has a waveform of (vii).

As shown in (i), when a voltage is suddenly changed in the sense portion 20, a voltage of the overlapping capacitor C3 may be suddenly changed. That is, when a voltage increases in the sense portion 20, voltages at opposite ends of the overlapping capacitor C3 increases and a voltage at the first node (node1) increases. In this case, when a signal such as (iv') is applied from the compensation voltage line 131, the voltage that increases in the first node (node 1) increases. Accordingly, no voltage change occurs or the voltage is hardly changed at the first node (node 1). When the intensity of the compensation signal applied to the compensation voltage line 131 is the same as that of the signal transmitted from the sense portion 20, no voltage change occurs in the first node (node 1), but when the intensity of the compensation signal applied to the compensation voltage line 131 is similar to that of the signal transmitted from the sense portion 20, the voltage may be partially changed in the first node (node 1).

That is, noise transmitted as the voltage is coupled at the sense portion 20 may be removed in the first node (node 1). Thus, a data voltage supplied from the data line 171 may be directly applied to the second transistor T2, and the first transistor T1 may control luminance of the light emitting diode LED according to the data voltage.

Accordingly, the display device according to the example embodiment can prevent luminance change of the light emitting diode according to operation of the sense electrode by removing noise introduced into pixels.

Although it is not illustrated in FIG. 12, a voltage applied from the compensation voltage line may adjust application timing of a compensation signal according to application timing of a gate signal as previously described in FIG. 5. The compensation signal is delayed and applied according to the time at which the gate signal is applied such that the display device can reduce the power consumption required by the sense portion.

Hereinafter, referring to FIG. 13A and FIG. 13B, a controller that controls a display panel and a sense portion will be described.

Figure 13A:
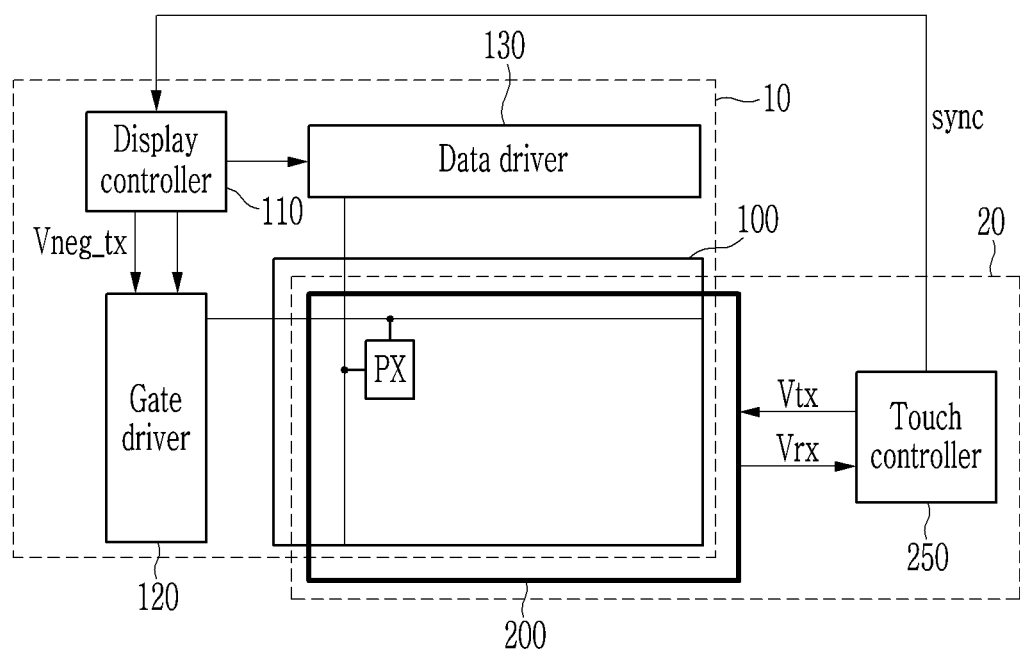
FIG. 13A and FIG. 13B are block diagrams provide for describing a voltage applied to a display device according to an example embodiment.
Figure 13B:
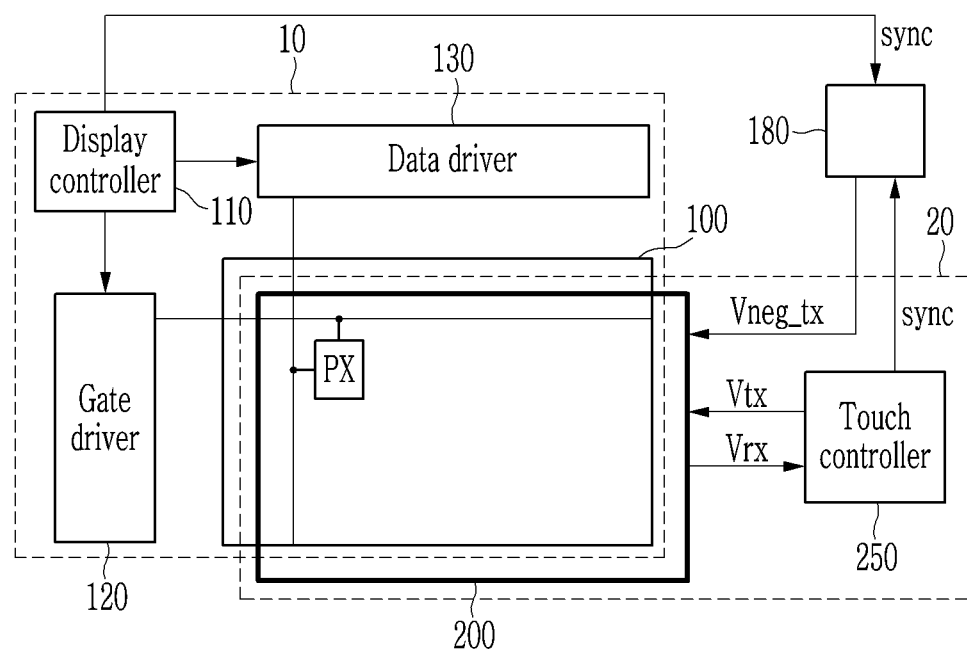

FIG. 13A and FIG. 13B are block diagrams provide for describing a voltage applied to a display device according to an example embodiment. Since FIG. 13A and FIG. 13B are similar to FIG. 6A and FIG. 6B, the description will focus on the differences Referring to FIG. 13A and FIG. 13B, a display panel 10 includes a display controller 110 that drives a display portion 100, a gate driver 120, and a data driver 130. A sense portion 20 includes a plurality of sense electrodes 200, and a sense controller 250 that drives the plurality of sense electrode portions 200.

Referring to FIG. 13A, the sense controller 250 applies a control signal to the plurality of sense electrode portions 200. In this case, the control signal includes a first sense signal S_tx for driving a first sense electrode, and a second sense signal S_rx for driving a second sense electrode. Here, the first sense signal S_tx may be a signal for controlling a first sense voltage source Vtx, and the second sense signal S_rx may be a signal for controlling the second sense voltage source Vrx.

In addition, the sense controller 250 applies a synchronization signal sync that corresponds to the first sense signal S_tx to the display controller 110. The display controller 110 generates a compensation signal to correspond to the synchronization signal sync, and may apply a control signal that can generate a compensation signal neg_tx to the gate driver 120. Accordingly, the gate driver 120 may apply a compensation signal to the display portion 100, and the display portion 100 can directly transmit the compensation signal through a compensation voltage line. This can be determined in the display device described with reference to FIG. 12.

Referring to FIG. 13B, a display device includes a display controller 110, a sense controller 250, and a third circuit portion 180.

The display controller 110 transmits a synchronization signal sync that relates to timing at which a pixel can be driven according to a scan signal applied to a second gate electrode of a second transistor T2 and a data voltage applied to a second electrode, to the third circuit portion 180. Here, the display controller 110 may apply a voltage having a waveform that is similar to the waveform shown in FIG. 5.

The sense controller 250 transmits the synchronization signal sync that corresponds to a first sense signal S_tx to the third circuit portion 180. The synchronization signal sync has a phase that is inverted with respect to a phase of the first sense signal S_tx, and may include information for generating a compensation signal having the same or similar intensity.

The third circuit portion 180 respectively receives the synchronization signal sync from the display controller 110 and the sense controller 250 and generates a compensation signal neg_tx, and applies the compensation signal neg_tx to the sense electrodes 200. The compensation signal neg_tx is a signal that can remove noise, which may be generated from the first sense signal S_tx. Accordingly, even when noise is generated due to coupling of the first sense signal S_tx, the noise introduced into the data line of the display portion 100 can be removed by the compensation signal neg_tx, and thus, the display device according to the example embodiment can prevent luminance change of the light emitting diode according to operation of the sense electrode.

Hereinafter, effects of a display device according to an example embodiment will be described with reference to FIG. 14 and FIG. 15.

Figure 14:
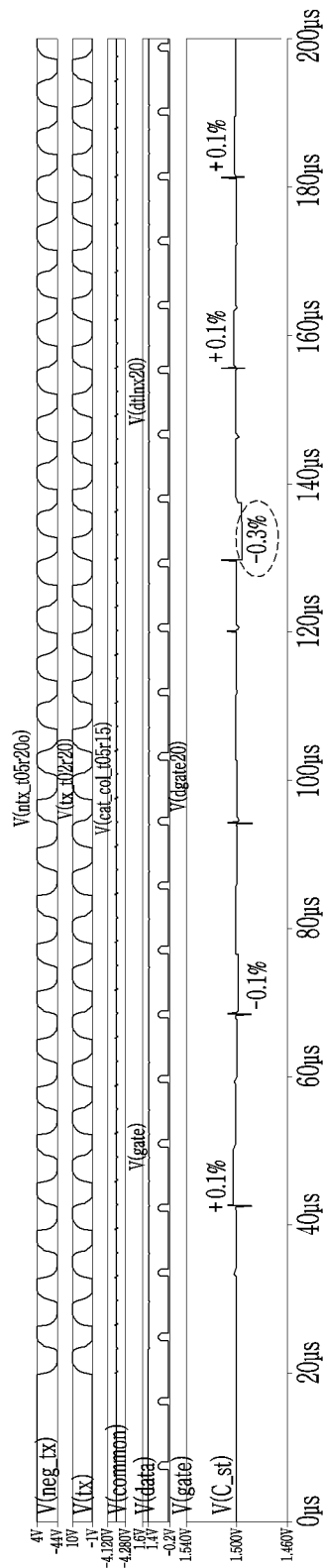
FIG. 14 is a graph that illustrates a voltage change in a display device according to an example embodiment.
Figure 15:
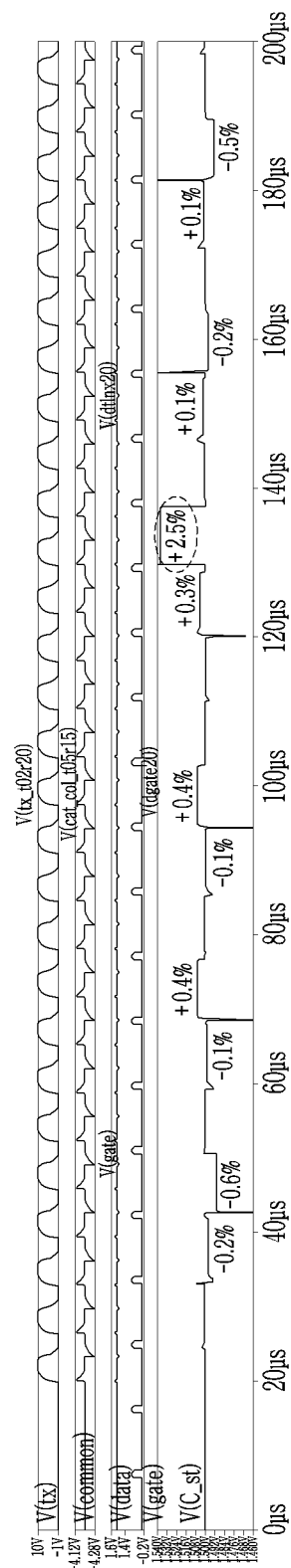
FIG. 15 is a graph that illustrates a voltage change in a display device according to a comparative example.

FIG. 14 is a graph that illustrates a voltage change in a display device according to an example embodiment, and FIG. 15 is a graph that illustrates a voltage change in a display device according to a comparative example. FIG. 14 and FIG. 15 will be described with reference to FIG. 1 and FIG. 2.

Referring to FIG. 14, a compensation signal neg_tx applied to a display device according to an example embodiment may be the same as or similar to a first sense signal S_tx in intensity, while having an inverted phase. A common voltage Vcom is almost constantly maintained without a change. Referring back to FIG. 1, as noise is removed in a first node (node 1), the common voltage Vcom is almost constantly maintained without a change. The noise may not be completely removed in the first node (node 1), and even through the noise is not completely removed, the common voltage Vcom in the display device according to the example embodiment may maintain a comparatively constant voltage compared to the common voltage Vcom of the comparative example of FIG. 15.

Depending on the data voltage applied to the second transistor T2 in FIG. 1, the light emitting diode LED may emit light, and depending on a change of the data voltage, a voltage change at the storage capacitor Cst hardly occurs.

Accordingly, it can be determined that a voltage change at the storage capacitor Cst is about ±0.1%, and about −0.3% as a maximum.

That is, in the display device according to the example embodiment, the noise which may occur due to coupling of the first sense signal S_tx can be removed, and thus luminance change of the light emitting diode according to the operation of the sense electrode can be prevented.

Referring to FIG. 15, in the display device according to the comparative example, the compensation signal neg_tx is not applied and only the first sense signal S_tx exists.

As the first signal S_tx is changed, noise is transmitted to the first node (node 1) and thus the common voltage Vcom is changed. Such a common voltage Vcom including noise is applied to a pixel, and thus a voltage of the storage capacitor Cst is changed by upto about +2.5%.

That is, in the comparative example, a signal that can remove noise which may occur as the first sense signal S_tx is coupled is not included, and thus a voltage change at the storage capacitor Cst significantly occurs. Accordingly, a luminance change may occur in the light emitting diode of the display device according to the comparative example.

Hereinafter, referring to FIG. 16, a display device according to an example embodiment will be described.

Figure 16:
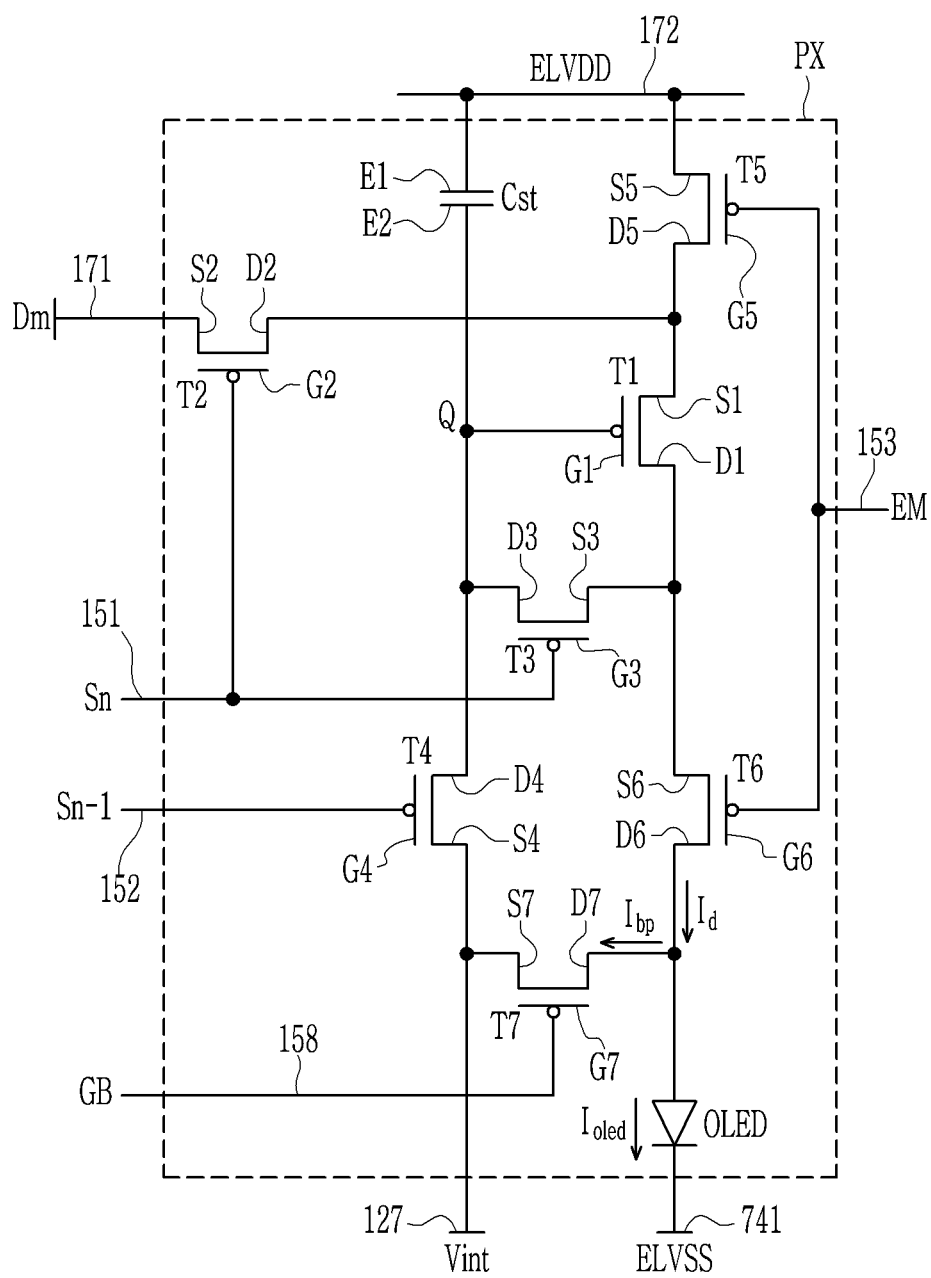
FIG. 16 is an equivalent circuit diagram of a pixel of a display device according to an example embodiment.

FIG. 16 is an equivalent circuit diagram of a pixel of a display device according to an example embodiment. The pixel illustrated in FIG. 16 may be implemented as the pixel PX of FIG. 1A. Here, the display device may be an organic light emitting display OLED.

Referring to FIG. 16, a pixel PX of an organic light emitting display includes a plurality of transistors T1, T2, T3, T4, T5, T6, and T7 electrically connected to a plurality of signal lines 127, 151, 152, 153, 158, 171, 172, and 741, a storage capacitor Cst, and an organic light emitting diode OLED.

The organic light emitting display includes a display area where an image is displayed, and the pixel PX is arranged in various formats in the display area.

The plurality of transistors T1, T2, T3, T4, T5, T6, and T7 include a driving transistor T1, and switching transistors electrically connected to a scan line, that is, second and third transistors T2 and T3, and other transistors for operation of the organic light emitting diode OLED are called transistors (hereinafter referred to as compensation transistors) for necessary operation of the organic light emitting diode OLED. The compensation transistors T4, T5, T6, and T7 may include a fourth transistor T4, a fifth transistor T5, a sixth transistor T6, and a seventh transistor T7. The plurality of signal lines 127, 151, 152, 153, 158, 171, 172, and 741 may include a scan line 151, a previous stage scan line 152, alight emission control line 153, a bypass control line 158, a data line 171, a driving voltage line 172, an initialization voltage line 127, and a common voltage line 741. The bypass control line 158 may be a part of the previous stage scan line 152 or may be electrically connected to the previous stage scan line 152.

The scan line 151 is electrically connected to agate driver (not shown) and thus transmits a scan signal Sn to the second transistor T2 and the third transistor T3. The previous stage scan line 152 is electrically connected to the gate driver and transmits a previous stage scan signal S(n−1) applied to a pixel PX located in a previous stage to the fourth transistor T4. The light emission control line 153 is electrically connected with alight emission controller (not shown), and transmits a light emission control signal EM that controls light emission time of the organic light emitting diode OLED to the fifth transistor T5 and the sixth transistor T6. A bypass control line 158 transmits a bypass signal GB to the seventh transistor T7.

The data line 171 is a wire that transmits a data voltage Dm generated by a data driver (not shown), and luminance of the light organic light emitting diode (also referred to as an organic light emitting element) is changed according to the data voltage Dm. The driving voltage line 172 applies a driving voltage ELVDD, the initialization voltage line 127 transmits an initialization voltage Vint that initializes the driving transistor T1, and the common voltage line 741 applies the common voltage Vcom. The driving voltage line 172, the initialization voltage line 127, and the common voltage line 741 may be respectively applied with constant voltages.

Referring to FIG. 16, a gate electrode G1 of the driving transistor T1 and a second electrode D3 of the third transistor T3 are electrically connected with each other through a driving gate node Q.

The driving transistor T1 controls intensity of an output current according to the data voltage Dm applied thereto, and an output driving current Id is applied to the organic light emitting diode OLED such that brightness of the organic light emitting diode OLED is adjusted according to the data voltage Dm. For this purpose, a first electrode S1 of the driving transistor T1 is disposed to be able to receive the driving voltage ELVDD, and is electrically connected with the driving voltage line 172 via the fifth transistor T5. In addition, the first electrode S1 of the driving transistor T1 is electrically connected with a second electrode D2 of the second transistor T2 and thus receives the data voltage Dm. A second electrode D1 of the driving transistor T1 (electrode at output side) is disposed to output a current toward the organic light emitting diode OLED, and thus is electrically connected with an anode of the organic light emitting diode OLED via the sixth transistor T6. Meanwhile, the gate electrode G1 is electrically connected with one electrode (i.e., a second storage electrode E2) of the storage capacitor Cst. Thus, a voltage of the gate electrode G1 is changed according to a voltage stored in the storage capacitor Cst, and accordingly, a driving current Id output from the driving transistor T1 is changed.

The second transistor T2 is a transistor that receives the data voltage Dm in the pixel PX. The gate electrode G2 is electrically connected with the scan line 151, and the first electrode S2 is electrically connected with the data line 171. The second electrode D2 of the second transistor T2 is electrically connected with the first electrode S1 of the driving transistor T1. When the second transistor T2 is turned on according to a scan signal Sn transmitted through the scan line 151, the data voltage Dm transmitted through the data line 171 is transmitted to the first electrode S1 of the driving transistor T1.

The third transistor T3 is a transistor that enables a compensation voltage (i.e., a voltage of Dm+Vth), which has been changed through the driving transistor T1 from the data voltage Dm, to be transmitted to a second storage electrode E2 of the storage capacitor Cst. The gate electrode G3 is electrically connected with the scan line 151, and a first electrode S3 is electrically connected with the second electrode D1 of the driving transistor T1. A second electrode D3 of the third transistor T3 is electrically connected with the second storage electrode E2 of the storage capacitor Cst and the gate electrode G1 of the driving transistor T1.

The third transistor T3 is turned on according to the scan signal Sn transmitted through the scan line 151 and electrically connects the gate electrode G1 and the second electrode D1 of the driving transistor T1, and electrically connects the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. A gate electrode G4 is electrically connected with a previous stage scan line 152, and a first electrode S4 is electrically connected to the initialization voltage line 127. A second electrode D4 of the fourth transistor T4 is electrically connected with the second storage electrode E2 of the storage capacitor Cst and the gate electrode G1 of the driving transistor T1 via the second electrode D3 of the third transistor T3. The fourth transistor T4 transmits the initialization voltage Vint to the gate electrode G1 of the driving transistor T1 and the second storage electrode E2 of the storage capacitor Cst according to a previous stage scan signal Sn−1 of the previous stage scan line 152. Accordingly, a gate voltage of the gate electrode G1 of the driving transistor T1 and the storage capacitor Cst are initialized. The initialization voltage Vint may be a voltage that can turn on the driving transistor T1 by having a low voltage value.

The fifth transistor T5 serves to transmit the driving voltage ELVDD to the driving transistor T1. A gate electrode G5 is electrically connected with the light emission control line 153, and a first electrode S5 is electrically connected with the driving voltage line 172. A second electrode D5 of the fifth transistor T5 is electrically connected with the first electrode S1 of the driving transistor T1.

The sixth transistor T6 serves to transmit the driving current Id output from the driving transistor T1 to the organic light emitting diode OLED. A gate electrode G6 is electrically connected with the light emission control line 153, and a first electrode S6 is electrically connected with the second electrode D1 of the driving transistor T1. A second electrode D6 of the sixth transistor T6 is electrically connected with the anode of the organic light emitting diode OLED.

The fifth transistor T5 and the sixth transistor T6 are simultaneously tuned on by a light emission control signal EM transmitted through the light emission control line 153, and when the driving voltage ELVDD is applied to the first electrode S1 of the driving transistor T1 through the fifth transistor T5, the driving transistor T1 outputs the driving current Id according to a voltage of the gate electrode G1 of the driving transistor T1 (i.e., a voltage of the second storage electrode E2 of the storage capacitor Cst). The output driving current Id is transmitted to the organic light emitting diode OLED through the sixth transistor T6. As an OLED current holed flows to the organic light emitting diode OLED, the organic light emitting diode OLED emits light.

The seventh transistor T7 serves to initialize the anode of the organic light emitting diode OLED. A gate electrode G7 is electrically connected with the bypass control line 158, a first electrode S7 is electrically connected with the anode of the organic light emitting diode OLED, and a second electrode D7 is electrically connected with the initialization voltage line 127. The bypass control line 158 may be electrically connected to the previous stage scan line 152, and a bypass signal GB is applied with a signal of the same timing as the previous scan signal Sn−1. The bypass control line 158 may transmit a signal separate from the previous stage scan signal Sn−1 rather than being electrically connected to the previous stage scan line 152. When the seventh transistor T7 is turned on according to the bypass signal GB, the initialization voltage Vint is applied to the anode of the organic light emitting diode OLED and thus the organic light emitting diode is initialized.

A first storage electrode E1 of the first storage capacitor Cst is electrically connected with the driving voltage line 172, and the second storage electrode E2 is electrically connected with the gate electrode G1 of the driving transistor T1, the second electrode D3 of the third transistor T3, and the second electrode D4 of the fourth transistor T4. Accordingly, the second storage electrode E2 determines a voltage of the gate electrode G1 of the driving transistor T1, and receives the data voltage Dm through the second electrode D3 of the third transistor T3 or receives the initialization voltage Vint through the second electrode D4 of the fourth transistor T4.

Meanwhile, the anode of the organic light emitting diode OLED is electrically connected with the second electrode D6 of the sixth transistor T6 and the first electrode S7 of the seventh transistor T7, and a cathode of the organic light emitting diode OLED is electrically connected with the common voltage line 741 that transmits a driving low voltage ELVSS.

The pixel circuit in the example embodiment of FIG. 16 includes seven transistors T1, T2, T3, T4, T5,T6, and T7 and one capacitor Cst, but this is not restrictive, and the number of transistors, the number of capacitors, and connections therebetween can be variously modified.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
   a display portion displaying an image; and
   a sense portion electrically connected with the display portion at a first node through an overlapping capacitor, the sense portion includes at least one of sense electrodes that sense an external input,
   wherein the display portion comprises:
   a gate line extending in a first direction;
   a data line extending in a second direction that is perpendicular to the first direction; and
   a compensation voltage line that extends in the first direction and is disposed perpendicular to the data line,
   wherein a compensation signal of which a phase is inverted with respect to a phase of a signal transmitted through the sense portion in the first node is applied to the compensation voltage line.

2. The display device of claim 1, wherein the compensation voltage line applies a signal that is delayed compared to a voltage applied to the data line.

3. The display device of claim 2, further comprising:
   a display controller that applies a control signal for driving the display portion; and
   a sense controller that applies a control signal for driving the sense electrode,
   wherein the sense controller transmits a synchronization signal according to a first sense signal to the display controller, and
   the display controller generates the compensation signal.

4. The display device of claim 3, further comprising a third circuit portion that receives a synchronization signal from the display controller and the sense controller,
   wherein the third circuit portion generates the compensation signal by reflecting the synchronization signal.

5. The display device of claim 1, wherein the sense portion comprises:
   at least one of first sense electrodes receiving a first sense signal that is changed in response to the external input;
   at least one of second sense electrodes disposed at a distance from the first sense electrodes; and at least one of compensation electrodes disposed at a distance from and between the first sense electrodes, and to which the compensation signal is applied.

* * * * *